US010731813B2

(12) United States Patent
Park et al.

(10) Patent No.: US 10,731,813 B2
(45) Date of Patent: Aug. 4, 2020

(54) LAMP FOR VEHICLE AND VEHICLE

(71) Applicant: ZKW Group GmbH, Wieselburg (AT)

(72) Inventors: Sunjung Park, Seoul (KR); Hankyu Cho, Seoul (KR)

(73) Assignee: ZKW Group GmbH, Wieselburg (AT)

( * ) Notice: Subject to any disclaimer, the term of this patent is extended or adjusted under 35 U.S.C. 154(b) by 0 days.

(21) Appl. No.: 16/240,029

(22) Filed: Jan. 4, 2019

(65) Prior Publication Data
US 2019/0211987 A1 Jul. 11, 2019

(30) Foreign Application Priority Data
Jan. 5, 2018 (KR) .................. 10-2018-0001843

(51) Int. Cl.
*F21S 41/145* (2018.01)
*F21S 43/145* (2018.01)
(Continued)

(52) U.S. Cl.
CPC .......... *F21S 41/145* (2018.01); *F21S 41/153* (2018.01); *F21S 41/155* (2018.01); *F21S 41/255* (2018.01); *F21S 41/32* (2018.01); *F21S 41/321* (2018.01); *F21S 43/14* (2018.01); *F21S 43/145* (2018.01); *F21S 43/31* (2018.01); *F21S 45/47* (2018.01); *F21S 45/49* (2018.01); *F21V 23/005* (2013.01); *H05K 1/028* (2013.01); *H05K 1/189* (2013.01);
(Continued)

(58) Field of Classification Search
CPC ...... F21S 41/145; F21S 41/153; F21S 41/321; F21S 41/32; F21S 41/155; F21S 41/255; F21S 43/31; F21S 43/145; F21S 45/47; F21S 45/49; F21S 43/14; F21S 43/255; H05K 1/189; H05K 1/028; H05K 2201/10106; F21Y 2107/10; F21Y 2107/50; F21Y 2107/70; F21Y 2105/12; F21Y 2115/10; H01L 25/0753; F21V 23/005

See application file for complete search history.

(56) References Cited

U.S. PATENT DOCUMENTS 6,299,337 B1 * 10/2001 Bachl .................. H01L 25/13
362/545
9,194,566 B2 * 11/2015 Oh ...................... F21V 21/00
(Continued)

FOREIGN PATENT DOCUMENTS

DE 202016103287 7/2016
EP 1033525 9/2000
(Continued)

OTHER PUBLICATIONS

Extended European Search Report in European Application No. 19150409.1, dated Apr. 8, 2019, 10 pages.

*Primary Examiner* — Kevin Quarterman
(74) *Attorney, Agent, or Firm* — Fish & Richardson P.C.

(57) ABSTRACT

A lamp for a vehicle includes an array module including a plurality of micro Light Emitting Diode (LED) chips. The array module includes a plurality of regions, where each region includes one or more arrays. Each array includes at least a portion of the plurality of micro LED chips. At least one of the plurality of regions includes arrays that are stacked to each other, where a number of arrays stacked at a first region among the plurality of regions is different from a number of arrays stacked in a second region among the plurality of regions.

20 Claims, 21 Drawing Sheets

(51) Int. Cl.
*F21S 43/31* (2018.01)
*F21S 41/255* (2018.01)
*F21S 41/155* (2018.01)
*F21S 41/32* (2018.01)
*F21S 41/153* (2018.01)
*F21S 43/14* (2018.01)
*F21S 45/49* (2018.01)
*F21S 45/47* (2018.01)
*F21V 23/00* (2015.01)
*H05K 1/02* (2006.01)
*H05K 1/18* (2006.01)
*F21Y 115/10* (2016.01)
*F21Y 105/12* (2016.01)
*F21Y 107/70* (2016.01)
*F21Y 107/50* (2016.01)
*H01L 25/075* (2006.01)
*F21S 43/20* (2018.01)
*F21Y 107/10* (2016.01)

(52) U.S. Cl.
CPC ......... *F21S 43/255* (2018.01); *F21Y 2105/12* (2016.08); *F21Y 2107/10* (2016.08); *F21Y 2107/50* (2016.08); *F21Y 2107/70* (2016.08); *F21Y 2115/10* (2016.08); *H01L 25/0753* (2013.01); *H05K 2201/10106* (2013.01)

(56) References Cited

U.S. PATENT DOCUMENTS

| | | | |
|---|---|---|---|
| 9,890,916 | B2* | 2/2018 | Oh .................. B60Q 1/0041 |
| 9,967,981 | B2* | 5/2018 | Aiso .................. H05K 3/105 |
| 10,364,966 | B2* | 7/2019 | Jo .................. F21S 41/151 |
| 2013/0200408 | A1* | 8/2013 | Wang .................. H01L 25/0753 257/91 |

FOREIGN PATENT DOCUMENTS

| | | |
|---|---|---|
| EP | 2626900 | 8/2013 |
| EP | 3210828 | 8/2017 |
| JP | 2011090903 | 5/2011 |
| JP | 2011249534 | 12/2011 |
| JP | 2017174830 | 9/2017 |
| JP | 2017228699 | 12/2017 |
| KR | 1020110011619 | 2/2011 |
| KR | 1020130095327 | 8/2013 |
| WO | WO2010014032 | 2/2010 |

\* cited by examiner

200m

200m

200m

LAMP FOR VEHICLE AND VEHICLE

CROSS-REFERENCE TO RELATED APPLICATION

This application claims the priority benefit of Korean Patent Application No. 10-2018-0001843, filed on Jan. 5, 2018, in the Korean Intellectual Property Office, the disclosure of which is incorporated herein by reference.

FIELD

The present disclosure relates to a lamp for a vehicle, and a vehicle including the lamp.

BACKGROUND

A vehicle is an apparatus that can transport a user in a direction desired by the user. One example of a vehicle may be an automobile.

A vehicle may include various lamps. For example, the vehicle may include a head lamp, a rear combination lamp, and a fog lamp.

The lamps for vehicle may be classified as lamps for securing visibility for a driver (e.g., a head lamp and a fog lamp), and lamps for notifying a simple signal (e.g., a rear combination lamp).

Various devices may be used as light sources of the lamps provided in a vehicle.

Recently, there have been efforts to utilize a plurality of micro Light Emitting Diode (LED) chips as light sources of the lamps for vehicle.

It is of interest to provide a sufficient amount of light using a plurality of micro LED chips as a light source for the lamp for the vehicle.

SUMMARY

The present disclosure provides a lamp for a vehicle, which is capable of securing a sufficient amount of light using a plurality of micro Light Emitting Device (LED) chips.

The present disclosure provides a vehicle including the lamp.

Objects of the present disclosure should not be limited to the aforementioned objects and other unmentioned objects will be clearly understood by those skilled in the art from the following description.

According to one aspect of the subject matter described in this application, a lamp for a vehicle includes an array module including a plurality of micro Light Emitting Diode (LED) chips. The array module includes a plurality of regions, where each region includes one or more arrays and each array includes at least a portion of the plurality of micro LED chips. At least one of the plurality of regions includes arrays that are stacked to each other, where a number of arrays stacked at a first region among the plurality of regions is different from a number of arrays stacked in a second region among the plurality of regions. The first region is different from the second region.

Implementations according to this aspect may include one or more of the following features. For example, the array module may further include a Flexible Printed Circuit Board (FPCB) configured to seat the one or more arrays. In some examples, the plurality of regions include a first bending region configured to bend toward a light emission direction of light generated by the array module. In some examples, a number of arrays stacked in the first bending region is configured to determine a degree of bending of the first bending region. In some examples, the degree of bending of the first bending region is configured to increase based on an increase of the number of arrays stacked in the first bending region.

In some implementations, the first bending region is configured to bend in at least one of a left-right direction or an upward-downward direction with respect to a forward direction of the vehicle. In some examples, the first bending region is configured to seat first stacked arrays of one or more micro LED chips configured to generate first light, where the first bending region is configured to orient the first light toward a first light emission direction. The plurality of regions of the array module may further include a second bending region that is configured to bend toward a second light emission direction parallel to the first light emission direction and that is configured to seat second stacked arrays of micro LED chips configured to generate second light. The second bending region is configured to orient the second light toward the second light emission direction, where a number of the second stacked arrays is different from a number of the first stacked arrays.

In some implementations, the array module further includes one or more bending regions that are configured to bend toward a direction opposite to a light emission direction of light generated by the array module. In some examples, the one or more bending regions are configured to guide, to a target located outside of the vehicle, light generated by one or more micro LED chips disposed at the one or more bending regions. In some examples, the one or more bending regions are configured to bend in at least one of a left-right direction or an upward-downward direction with respect to a forward direction of the vehicle.

In some implementations, the lamp further includes a bracket configured to support the array module, where the bracket has a surface configured to face the array module. A bending shape of the array module is configured to determine a shape of the surface of the bracket that faces the array module.

In some examples, the lamp further includes a holder configured to fix the array module to the bracket. In some examples, the lamp further includes a heat dissipation part configured to dissipate heat generated by the array module, the heat dissipation part being configured to penetrate the bracket. In some examples, the lamp further includes an adhesive portion configured to attach the array module to the heat dissipation part.

According to another aspect, a vehicle includes one or more wheels, a power source configured to drive the one or more wheels, and a lamp mounted to the vehicle. The lamp includes an array module including a plurality of micro Light Emitting Diode (LED) chips. The array module includes a plurality of regions, where each region includes one or more arrays and each array includes at least a portion of the plurality of micro LED chips. At least one of the plurality of regions includes arrays that are stacked to each other, where a number of arrays stacked at a first region among the plurality of regions is different from a number of arrays stacked in a second region among the plurality of regions, the first region being different from the second region.

Implementations according to this aspect may include one or more of the features described above with respect to the lamp for a vehicle.

The implementations of the present disclosure may have one or more of the following effects.

First, it is possible to secure a sufficient amount of light using a plurality of micro LEDs.

Second, it is possible to realize various light outputting effects using the plurality of micro LEDs that are controllable by a control unit, one or more processors, or the like.

Third, it is possible to provide an amount of light as much as needed to each region of light irradiation areas.

Effects of the present disclosure should not be limited to the aforementioned effects and other unmentioned effects will be clearly understood by those skilled in the art from the claims.

BRIEF DESCRIPTION OF THE DRAWINGS

The implementations will be described in detail with reference to the following drawings in which like reference numerals refer to like elements.

DETAILED DESCRIPTION

Figure 1:
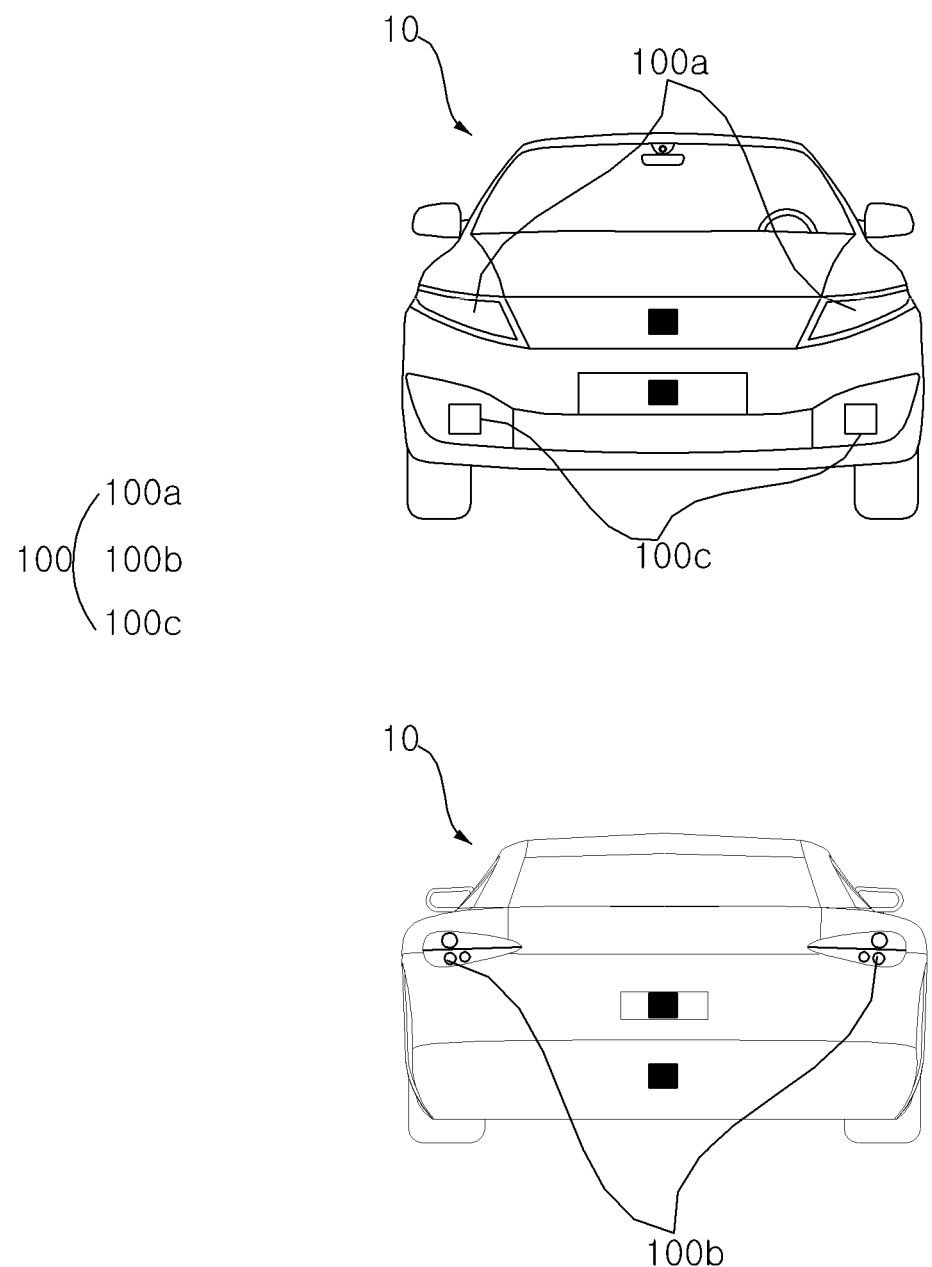
FIG. 1 is a diagram illustrating an example exterior appearance of an example vehicle.

Hereinafter, the implementations disclosed in the present specification will be described in detail with reference to the accompanying drawings, and the same or similar elements are denoted by the same reference numerals even though they are depicted in different drawings and redundant descriptions thereof will be omitted.

A vehicle as described in this specification may include, but not be limited to, an automobile and a motorcycle. Hereinafter, a description will be given based on an automobile.

A vehicle as described in this specification may include one or more of an internal combustion engine vehicle including an engine as a power source, a hybrid vehicle including both an engine and an electric motor as a power source, or an electric vehicle including an electric motor as a power source.

In the following description, "the left side of the vehicle" refers to the left side in the forward driving direction of the vehicle, and "the right side of the vehicle" refers to the right side in the forward driving direction of the vehicle.

In the following description, an array module 200$m$ may include one or more arrays.

The array module 200$m$ may include one or more layers, and one array may be disposed on one layer.

FIG. 1 is a diagram illustrating an example exterior appearance of an example vehicle.

Referring to FIG. 1, a vehicle 10 may include a lamp 100.

The lamp 100 may include a head lamp 100$a$, a rear combination lamp 100$b$, and a fog lamp 100$c$.

The lamp 100 may further include a room lamp, a turn signal lamp, a daytime running lamp, a back lamp, a positioning lamp, etc.

In some implementations, the term "overall length" refers to the length from the front end to the rear end of the vehicle 10, the term "overall width" refers to the width of the vehicle 10, and the term "overall height" refers to the height from the bottom of the wheel to the roof. In the following description, the term "overall length direction L" may be the reference direction for the measurement of the overall length of the vehicle 10, the term "overall width direction W" may be the reference direction for the measurement of the overall width of the vehicle 10, and the term "overall height direction H" may be the reference direction for the measurement of the overall height of the vehicle 10.

Figure 2:
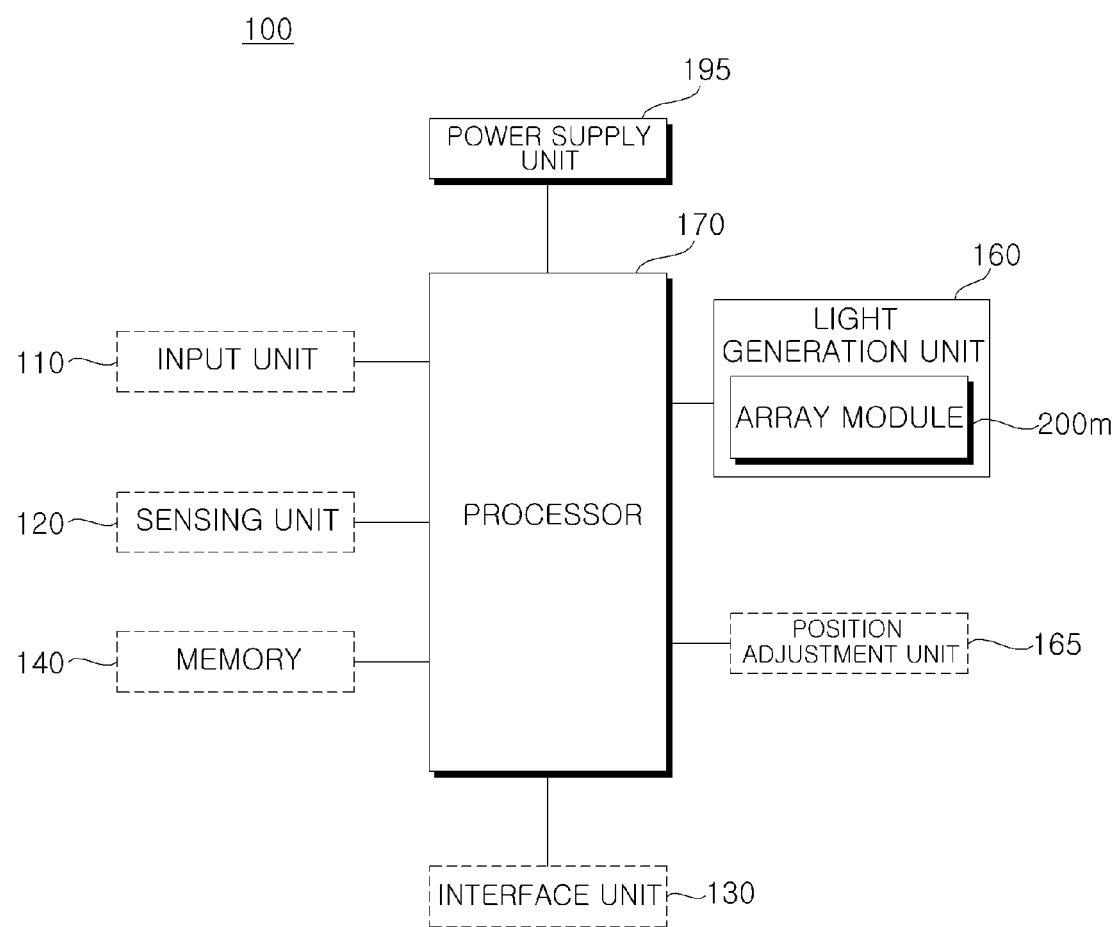
FIG. 2 is a block diagram illustrating an example of a lamp for a vehicle.

FIG. 2 is a block diagram illustrating an example of a lamp for a vehicle.

Referring to FIG. 2, the lamp 100 may include a light generation unit 160, a processor 170, and a power supply unit 195.

The lamp 100 may further include an input unit 110, a sensing unit 120, an interface unit 130, a memory 140, and a position adjustment unit 165 individually or in combination thereof.

The input unit 110 may receive a user input for controlling the lamp 100.

The input unit 110 may include one or more input devices. For example, the input unit 110 may include at least one of a touch input device, a mechanical input device, a gesture input device, or a sound input device.

The input unit 110 may receive a user input for controlling operation of the light generation unit 160.

For example, the input unit 110 may receive a user input for turning on or off the light generation unit 160.

The sensing unit 120 may include one or more sensors.

For example, the sensing unit 120 may include at least one of a temperature sensor or an illumination sensor.

The sensing unit 120 may acquire temperature information of the light generation unit 160.

The sensing unit 120 may acquire illumination information about the outside of the vehicle 10.

The interface unit 130 may exchange information, data, or a signal with another device provided in the vehicle 10.

The interface unit 130 may transmit at least one of information, data, or a signal, received from another device provided in the vehicle 10, to the processor 170.

The interface unit 130 may transmit at least one of information, data, or a signal, generated by the processor 170, to another device provided in the vehicle 10.

The interface unit 130 may receive driving situation information.

The driving situation information may include at least one of the following: information about an object outside the vehicle 10, navigation information, or vehicle state information.

The information about an object outside the vehicle 10 may include the following: information about the presence of the object, information about a location of the object, information about movement of the object, information about a distance between the vehicle 10 and the object, information about a relative speed between the vehicle 10 and the object, and information about a type of the object.

The information about the object may be generated by an object detection apparatus provided in the vehicle 10. The object detection apparatus may detect an object based on sensing data generated by one or more of a camera, a radar, a lidar, an ultrasonic sensor, and an infrared sensor.

The object may include a line, another vehicle, a pedestrian, a two-wheeled vehicle, a traffic sign, light, a road, a structure, a bump, a geographic feature, an animal, etc.

The navigation information may include at least one of the following: map information, information on a set destination, information on a route to the set destination, and information on various object located along the route, lane information, or information on the current location of the vehicle 10.

The navigation information may be generated by a navigation device provided in the vehicle 10.

The vehicle state information may include at least one of the following: vehicle position information, vehicle speed information, vehicle tilt information, vehicle weight information, vehicle direction information, vehicle battery information, vehicle fuel information, vehicle tire pressure information, vehicle steering information, in-vehicle temperature information, in-vehicle humidity information, pedal position information, or vehicle engine temperature information, among other things.

The vehicle state information may be generated based on sensing information about any of various sensors provided in the vehicle 10.

The memory 140 may store basic data for each unit of the lamp 100, control data for the operational control of each unit of the lamp 100, and input/output data of the lamp 100.

The memory 140 may be any of various hardware storage devices, such as a ROM, a RAM, an EPROM, a flash drive, and a hard drive.

The memory 140 may store various data for the overall operation of the lamp 100, such as programs for the processing or control of the processor 170.

The memory 140 may be classified as a sub-element of the processor 170.

The light generation unit 160 may convert electrical energy into light energy under the control of the processor 170.

The light generation unit 160 may include an array module 200*m* in which multiple groups of micro Light Emitting Diode (LED) chips are arranged.

The array module 200*m* may be formed flexible.

For example, the array 200 may be formed flexible in a manner such that a Flexible Copper Clad Laminated (FCCL) substrate is disposed on a polyimide (PI) layer and then LED chips each few micrometers (um) are transferred onto the FCCL substrate.

The array module 200*m* may include one or more micro LED arrays 200.

In some implementations, the array module 200*m* may be formed such that a plurality of arrays are stacked on each other.

The multiple groups of micro LED chips may have different shapes.

A micro LED chip may be referred to as a micro LED light emitting device package.

A micro LED chip may include a light emitting device.

A micro LED chip may be of a few micrometers (um). For example, a micro LED chip may be 5-15 um.

A light emitting device of a micro LED chip may be transferred onto a substrate.

The array 200 may include a substrate, and a subarray in which a plurality of micro LED chips are arranged. In the array, one or more subarrays may be provided.

The subarray may have any of various shapes.

For example, the subarray may be in the shape of a figure of a predetermined area.

For example, the subarray may be in the shape of a circle, a polygon, a fan, etc.

It is desirable that the substrate include an FCCL substrate.

For example, a base 911 (see FIG. 5) and a first electrode 912 (see FIG. 5) may make up the substrate.

For example, a base 911 (see FIG. 8) and a second anode 912*b* (see FIG. 8) may make up a substrate.

The position adjustment unit 165 may adjust position of the light generation unit 160.

The position adjustment unit 165 may control the light generation unit 160 to be tilted. Due to the tilting control of the light generation unit 160, an output light may be adjusted in an upward-downward direction (e.g., an overall height direction).

The position adjustment unit 165 may control the light generation unit 160 to be panned. Due to the panning control of the light generation unit 160, an output light may be adjusted in a left-right direction (e.g., an overall width direction).

The position adjustment unit 165 may further include a driving force generation unit (e.g., a motor, an actuator, and a solenoid) which provides a driving force required to adjust a position of the light generation unit 160.

When the light generation unit 160 generates a low beam, the position adjustment unit 165 may adjust a position of the light generation unit 160 so that the light generation unit 160 outputs a light downward further than when generating a high beam.

When the light generation unit 160 generates a high beam, the position adjustment unit 165 may adjust a position of the light generation unit 160 so that the light generation unit 160 outputs a light upward further than when generating a low beam.

The processor 170 may be electrically connected to each unit of the lamp 100. The processor 170 may control overall operation of each unit of the lamp 100.

The processor 170 may control the light generation unit 160.

The processor 170 may control the light generation unit 160 by adjusting an amount of electrical energy to be supplied to the light generation unit 160.

The processor 170 may control the array module 200*m* on the basis of each region.

For example, the processor 170 may control the array module 200*m* on the basis of each region by supplying a different amount of electrical energy to micro LED chips arranged in each region of the array module 200*m*.

The processor 170 may control the array module 200*m* on the basis of each layer.

A plurality of layers in the array module 200*m* may be composed of a plurality of arrays 200.

For example, the processor 170 may control the array module 200*m* on the basis of each layer by supplying a different amount of electrical energy to each layer.

Under the control of the processor 170, the power supply unit 195 may supply electrical energy required to operate each unit of the lamp 100. In particular, the power supply unit 195 may be supplied with power from a battery inside the vehicle 10.

Figure 3A:
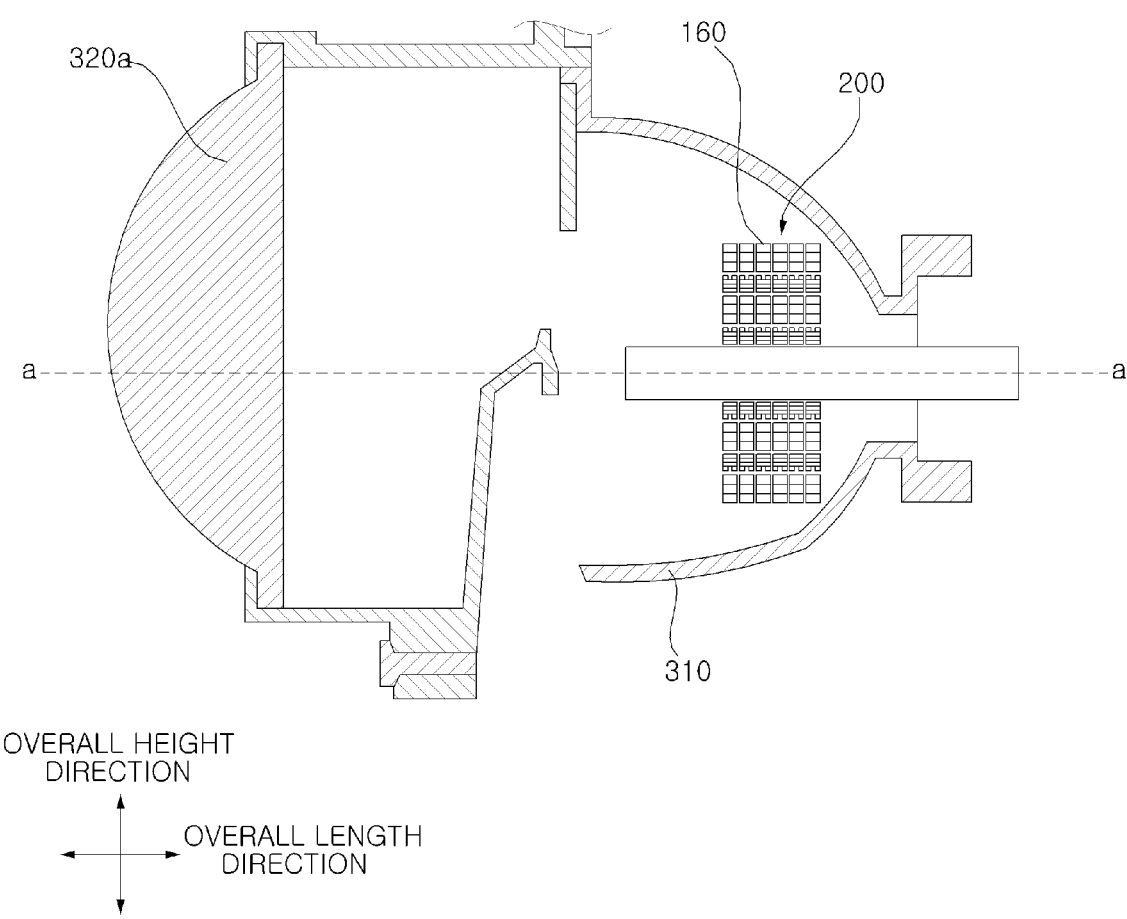
FIGS. 3A to 3C are diagrams illustrating examples of a lamp for a vehicle.
Figure 3B:
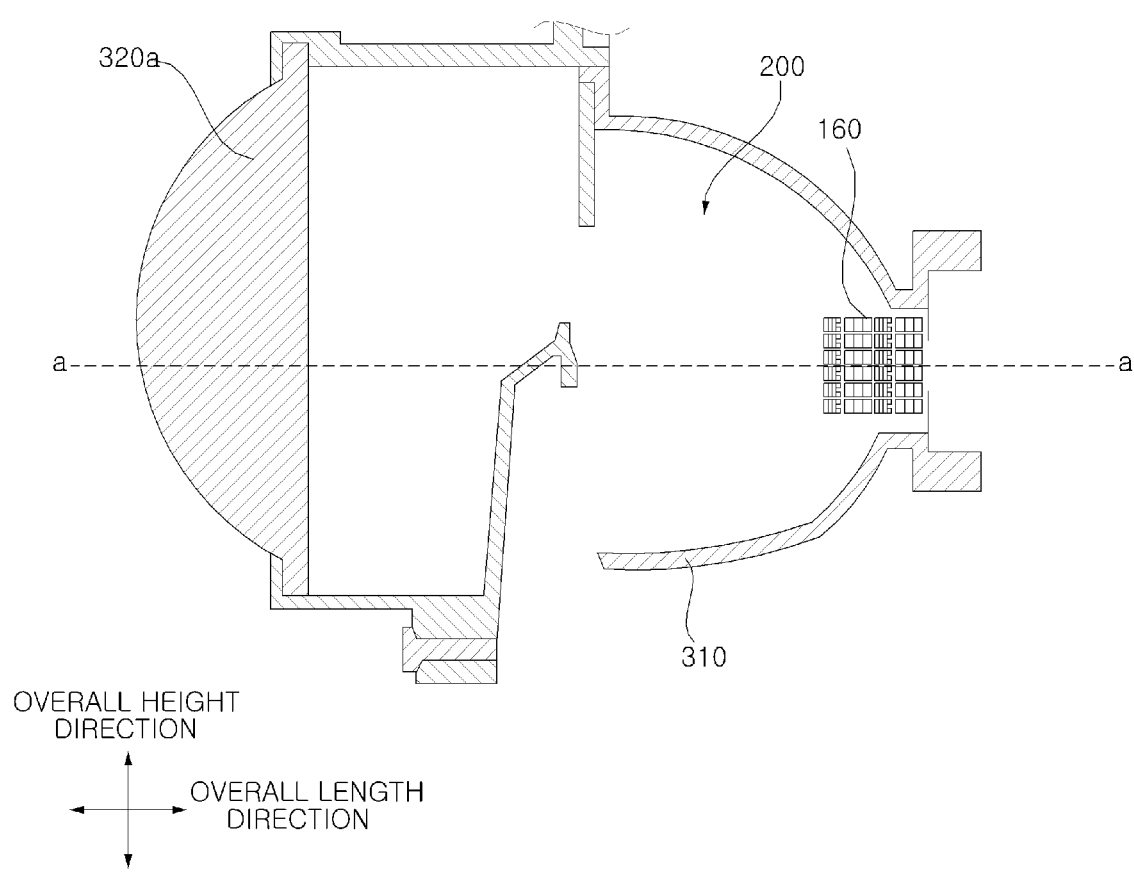
Figure 3C:
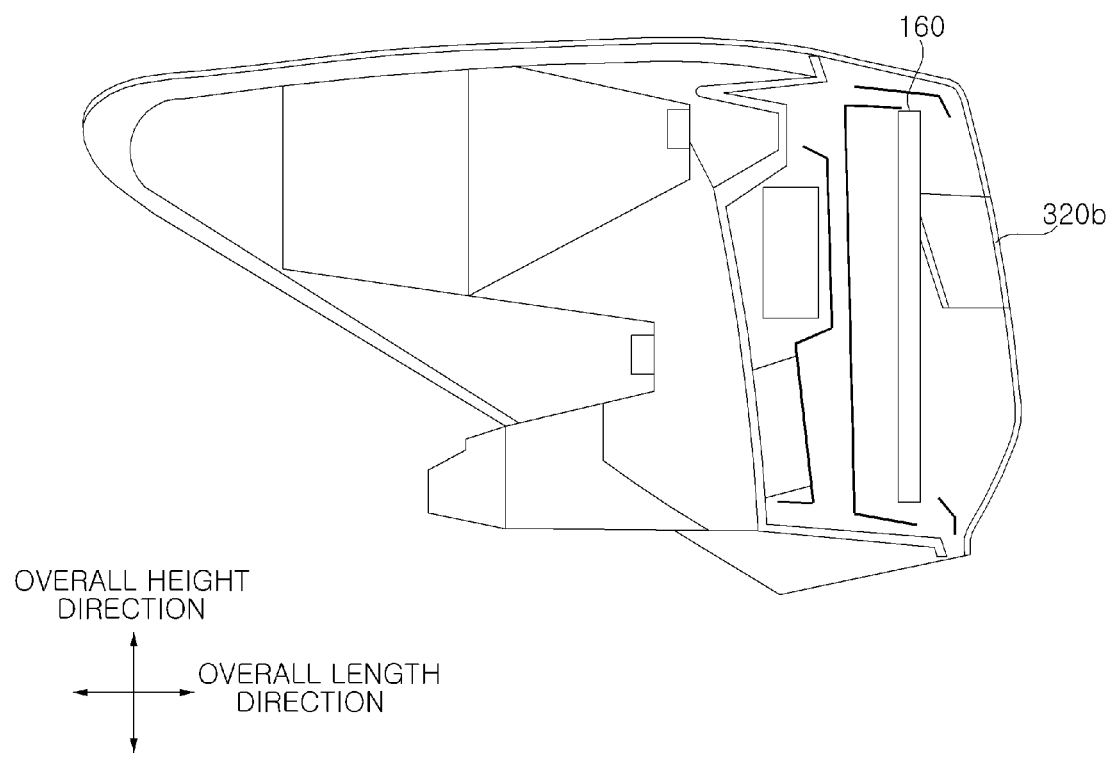

FIGS. 3A to 3C are diagrams illustrating examples of a lamp for a vehicle.

FIGS. 3A and 3B are examples of a cross-sectional view of the lamp 100 implemented as a head lamp 100a.

Referring to FIGS. 3A and 3B, the lamp 100 may include a light generation unit 160, a reflector 310, and a lens 320a.

The reflector 310 may reflect light generated by the light generation unit 160. The reflector 310 may guide light to be emitted forward or rearward of the vehicle 10.

The reflector 310 may be formed of a highly reflective material, such as aluminum (AL) and silver (Ag), or may be coated on a reflective surface.

The lens 320a may be disposed before the light generation unit 160 and the reflector 310. The lens 320a may refract light generated by the light generation unit 160 or light reflected by the reflector 310, and allow the refracted light to pass therethrough. The lens 320a may be an aspheric lens.

The lens 320a may change an optical path of light generated by the light generation unit 160.

The lens 320a may be formed of a transparent synthetic resin or glass.

As illustrated in FIG. 3A, the light generation unit 160 may output light in an overall height direction.

As illustrated in FIG. 3B, the light generation unit 160 may output light in an overall length direction.

FIG. 3C is a diagram illustrating an example of a lamp for a vehicle.

FIG. 3C is an example of a cross-sectional view of the lamp 100 implemented as a rear combination lamp 200b.

Referring to FIG. 3C, the lamp 100 may include a light generation unit 160 and a lens 320b.

The lens 320b may cover the light generation unit 160. The lens 320b may refract light generated by the light generation unit 160, and allow the refracted light to pass therethrough. The lens 320b may be an aspheric lens.

The lens 320b may change an optical path of light generated by the light generation unit 160.

The lens 320b may be formed of a transparent synthetic resin or glass.

Figure 4:
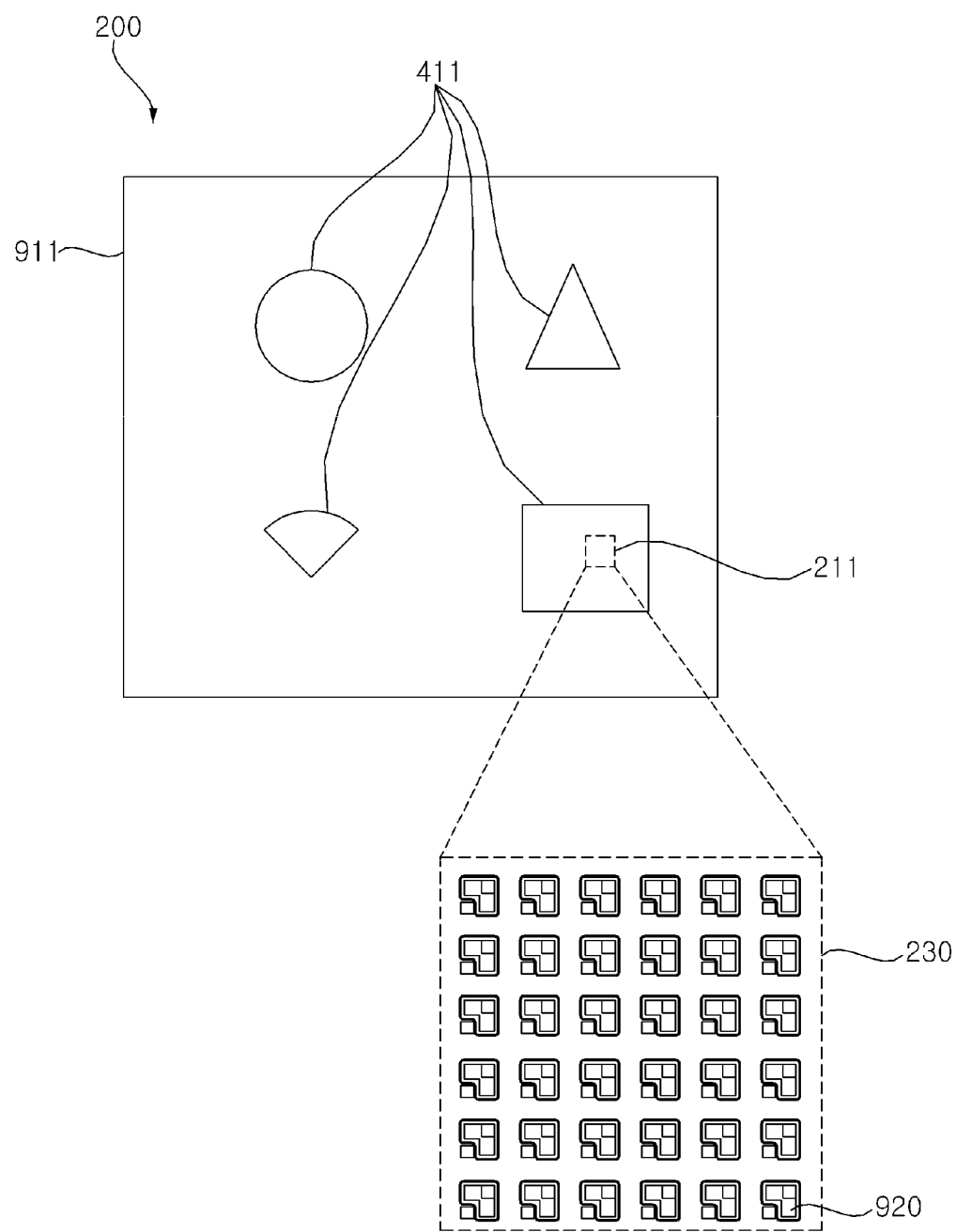
FIG. 4 is a diagram illustrating an example array including a plurality of micro LED chips and an example arrangement of the plurality of micro LED chips.

FIG. 4 is a diagram illustrating an example array including a plurality of micro LED chips and an example arrangement of the plurality of micro LED chips.

Referring to FIG. 4, a plurality of micro LED chips 920 may be disposed on an array 200.

The plurality of micro LED chips 920 may be transferred onto the array 200.

An interval between micro LED chips 920 on the flexible array 200, and a density of micro LED chips 920 (that is, the number of micro LED chips per unit area) on the flexible array 200 may be determined depending on a transfer interval.

The array 200 may include a plurality of sub-arrays 411 in which different groups of micro LED chips are arranged respectively.

The array 200 may include a base 911 and one or more sub-arrays 411.

The base 911 may be formed of a material such as a polyimide (PI).

In some implementations, the base 911 may be a concept including a polyimide layer and an FCCL substrate disposed on the polyimide layer.

Each of the sub-arrays 411 may be disposed on the base 911.

An array 230 that includes a plurality of micro LED chips 920 may be disposed on each of the sub-arrays 411.

The sub-array 411 may be generated by cutting a main array which is an FCCL substrate on which a plurality of micro LED chips 920 is disposed.

In this case, the shape of the sub-array 411 may be determined by a cut shape of the main array.

For example, the sub-array 411 may be in the shape of a two-dimensional figure (e.g., a circle, a polygon, and a fan).

Figure 5:
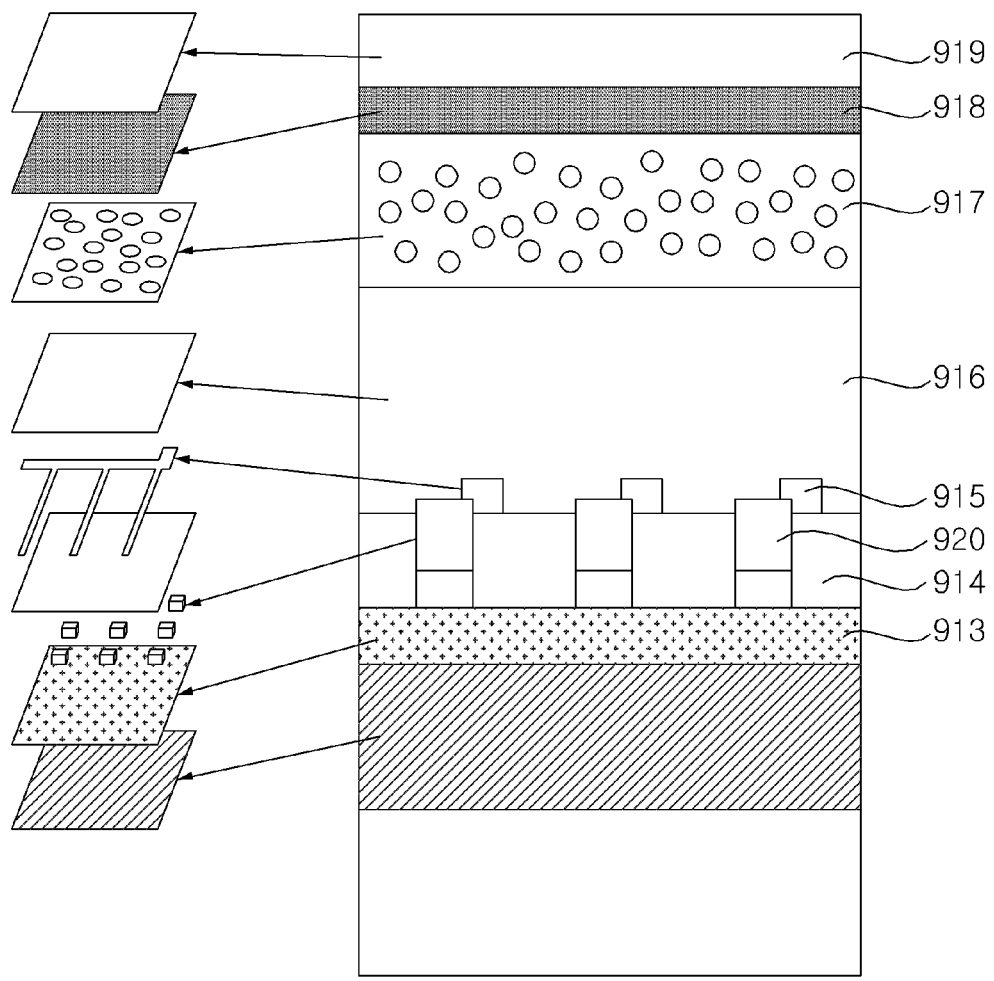
FIG. 5 is a diagram illustrating an example array including micro LED chips and an example arrangement of the micro LED chips.

FIG. 5 is a diagram illustrating an example array including micro LED chips and an example arrangement of the micro LED chips.

Referring to FIG. 5, the array 200 may include a polyimide layer 911, a FCCL substrate 912, a reflective layer 913, an inter-layer dielectric film 914, a plurality of micro LED chips 920, a second electrode 915, an optical spacer 916, a phosphor layer 917, a color filter film 918, and a cover film 919.

The polyimide layer 911 may be formed flexible.

The FCCL substrate 912 may be formed of copper. The FCCL substrate 912 may be referred to as a first electrode.

In some implementations, the polyimide layer 911 may be referred to as a base.

The first electrode and the second electrode may be electrically connected to the plurality of micro LED chips 920 so as to supply power thereto.

The first electrode 912 and the second electrode 915 may be light transmissive electrodes.

The first electrode 912 may be an anode.

The second electrode 915 may be a cathode.

The first electrode 912 and the second electrode 915 may a metal material which is one or a combination of the following: nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO) and Indium Zinc Oxide (IZO).

The first electrode 912 may be formed between the polyimide layer 911 and the reflective layer 913.

The second electrode 915 may be formed on the inter-layer dielectric film 914.

The reflective layer 913 may be formed on the FCCL substrate 912. The reflective layer 913 may reflect light generated by the plurality of micro LED chips 920. It is desirable that the reflective layer 913 may be formed of silver Ag.

The inter-layer dielectric film 914 may be formed on the reflective layer 913.

The plurality of micro LED chips 920 may be formed on the FCCL substrate 912. Each of the plurality of micro LED chips 920 may be attached to the reflective layer 913 or the FCCL substrate 912 using a solder material or an Anisotropic Conductive Film (ACF).

In some implementations, a micro LED chip 920 may be an LEC chip of 10-100 μm.

The optical spacer 916 may be formed on the inter-layer dielectric film 914. The optical spacer 916 may be used to keep a distance between the plurality of micro LED chips 920 and the phosphor layer 917, and may be formed of an insulating material.

The phosphor layer 917 may be formed on the optical spacer 916. The phosphor layer 917 may be formed of resin in which a phosphor is evenly distributed. Depending on a wavelength of light emitted from a micro LED chips 920, any one selected from a blue light-emitting phosphor, a blue-green light-emitting phosphor, a green light-emitting phosphor, a yellow-green light-emitting phosphor, a yellow light-emitting phosphor, a yellow-red light-emitting phosphor, an orange light-emitting phosphor, and a red light-emitting phosphor may be applied as the phosphor. That is, a phosphor may be excited by a light of a first color, which is emitted from the micro LED chips 920, to generate a light having a second color.

The color filter film 918 may be formed on the phosphor layer 917. The color filter film 918 may realize a specific color for light which has passed the phosphor layer 917. The color filter film 918 may realize at least one or a combination of red (R), green (G), and blue (B).

The cover film 919 may be formed on the color filter film 918. The cover film 919 may protect the array 200.

Figure 6:
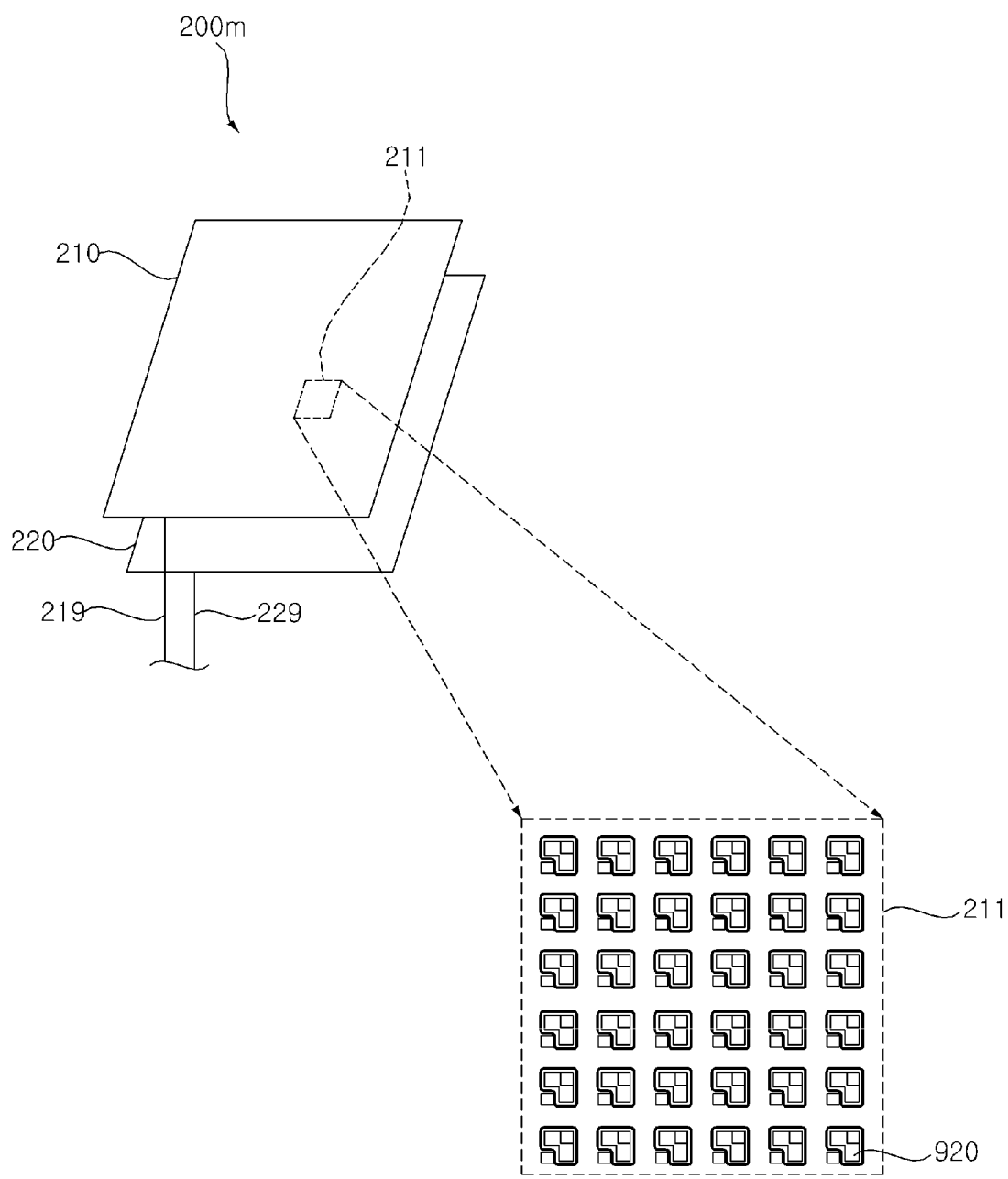
FIG. 6 is a diagram illustrating an example array module.

FIG. 6 is a diagram illustrating an example array module.

Referring to FIG. 6, the light generation unit 160 may include an array module 200m including a plurality of arrays.

For example, the light generation unit 160 may include a first array 210, a second array 220, and a last array 290.

The first array 210 may be different from the second array 220 in terms of at least one of the following: an interval between a plurality of micro LED chips, positions of the plurality of micro LED chips, or a density of the plurality of micro LED chips.

The second array 220 may be different from the first array 210 in terms of at least one of the following: an interval between a plurality of micro LED chips, positions of the plurality of micro LED chips, or a density of the plurality of micro LED chips.

The density of the plurality of micro LED chips indicates the number of micro LED chips per unit area.

A first group of micro LED chips may be disposed on the first array 210 in a first pattern 211.

The first pattern may be determined by at least one of the following: an interval between micro LED chips in the first group, positions of the micro LED chips in the first group on an array module, or a density of the micro LED chips in the first group.

A plurality of micro LED chips included in the first array 210 may be disposed at a first interval.

A plurality of micro LED chips included in the first group may be disposed at the first interval.

The second array 220 may be configured such that the plurality of micro LED chips included in the second group is disposed in a second pattern which is different from the first pattern.

The second pattern may be determined by at least one of the following: an interval between the micro LED chips in the second group, positions of the micro LED chips in the second group, or a density of the micro LED chips in the second group.

The plurality of micro LED chips included in the second array 220 may be disposed at an interval as the same as the interval at which the plurality of micro LED chips included in the first array 210 is disposed.

The plurality of micro LED chips included in the second group may be disposed at an interval as the same as the interval at which the plurality of micro LED chips included in the first group is disposed.

That is, the plurality of LED chips included in the second group may be disposed at the first interval.

The plurality of micro LED chips included in the second group may be disposed not to overlap the plurality of micro LED chips included in the first group in a vertical or horizontal direction.

For example, the first group of micro LED chips may be disposed on the first array 210 not to overlap the second group of micro LED chips, when viewed from above with the first array 210 and the second array 220 overlapping each other.

For example, the second group of micro LED may be disposed on the second array 220 not to overlap the first group of micro LED chips, when viewed from above with the second array 220 and the first array 210 overlapping each other.

Due to such arrangement, it is possible to minimize intervention of the micro LED chips belonging to the first group in output power from the micro LED chips belonging to the second group.

In some implementations, the light generation unit 160 may include three or more arrays.

Figure 7A:
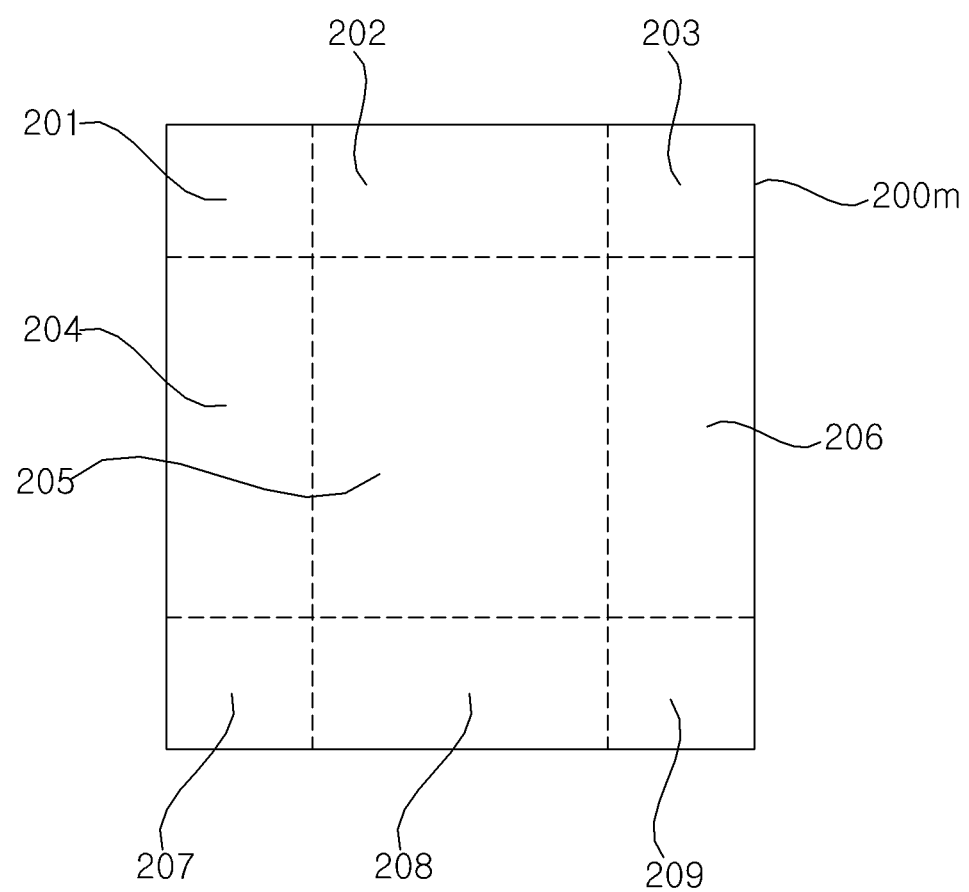
FIG. 7A is an example of a top view of an integrated array module.

FIG. 7A is an example of a top view of an integrated array module.

Figure 7B:
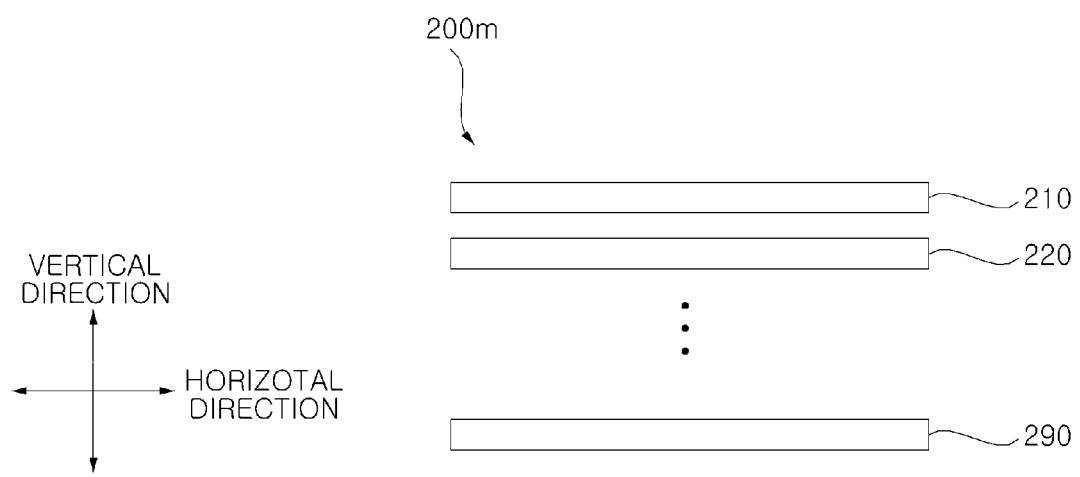
FIG. 7B is an example of a side view of an integrated array module.

FIG. 7B is an example of a side view of an integrated array module.

Referring to FIGS. 7A and 7B, the processor 170 may control the array module 200m on the basis of each region (regions 201 to 209).

The processor 170 may adjust a light distribution pattern by controlling the array module 200m on the basis of each region.

The array module 200m may be divided into a plurality of regions 201 to 209.

The processor 270 may adjust an amount of electrical energy to be supplied to each of the plurality of regions 201 to 209.

The processor 170 may control the array module 200m on the basis of each layer.

The processor 270 may adjust an amount of output light by controlling the array module 200m on the basis of each layer.

The array module 200m may be composed of a plurality of layers. The plurality of layers may be composed of a plurality of arrays, respectively.

For example, a first layer of the array module 200m may be formed by a first array, and a second layer of the array module 200m may be formed by a second array.

The processor 270 may adjust an amount of electrical energy to be supplied to each of the plurality of layers.

Figure 8:
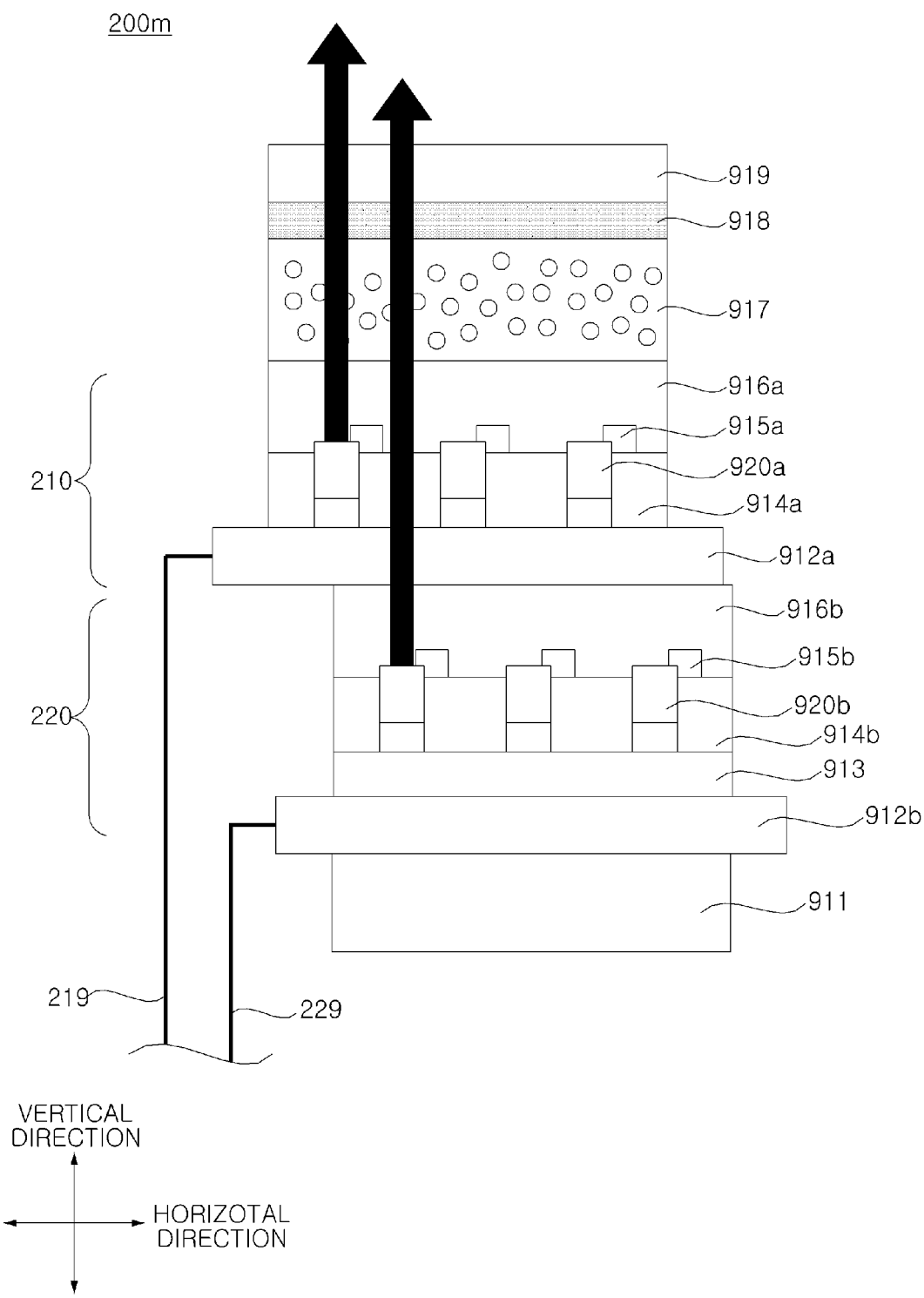
FIG. 8 is a diagram illustrating an example array module including a plurality of micro LED chips and an example arrangement of the plurality of micro LED chips.

FIG. 8 is a diagram illustrating an example array module including a plurality of micro LED chips and an example arrangement of the plurality of micro LED chips.

FIG. 8 shows an example in which the array module 200m includes a first array 210 and a second array 220, but the array module 200m may include three or more arrays.

Referring to FIG. 8, the array module 200m may include a polyimide layer 911, the first array 210, and a second array 220.

In some implementations, the array module 200m may further include a phosphor layer 917, a color filter film 918, and a cover film 919 individually or in combination thereof.

The polyimide layer 911 may be formed flexible.

The second array 220 may be disposed on the base 911.

In some implementations, a layer composed of the polyimide layer 911 or a second anode 912b may be referred to as a base.

In some implementations, the polyimide layer 911 may be referred to as a base.

The second array 220 may be disposed between the first array 210 and the base 911.

The second array 220 may include a second anode 912b, a reflective layer 913, a second inter-layer dielectric film 914b, a second group of micro LED chips 920b, a second optical spacer 916b, and a second cathode 915b.

The second anode 912b may be an FCCL substrate. The second anode 912b may be formed of copper.

The second anode 912b and the second cathode 915b may be light transmissive electrodes.

The second anode 912b and the second cathode 915b may be referred to as transparent electrodes.

The second array 220 may include a transparent electrode.

The second anode 912b and the second cathode 915b may include a metal material which is one or a combination of the following: nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO) and Indium Zinc Oxide (IZO).

The second anode 912b may be formed between the base 911 and the reflective layer 913.

The second cathode 915b may be formed on the second inter-layer dielectric film 914b.

The reflective layer 913 may be formed on the second anode 912b. The reflective layer 913 may reflect light generated by the plurality of micro LED chips 920. It is desirable that the reflective layer 913 may be formed of silver Ag.

The second inter-layer dielectric film 914b may be formed on the reflective layer 913.

The second group of micro LED chips 920b may be formed on the second anode 912b. Each micro LED chip 920b belonging to the second group may be attached to the reflective layer 913 or the second anode 912b using a solder material or an Anisotropic Conductive Film (ACF).

The second optical spacer 916b may be formed on the second inter-layer dielectric film 914b. The second optical spacer 916b is used to keep the micro LED chips 920b and the first flexible array 210 at a distance from each other, and the second optical spacer 916b may be made of an insulating material.

The first array 210 may be formed on the second array 220.

The first array 210 may include a first anode 912a, a first inter-layer dielectric film 914a, a first group of micro LED chips 920a, a first optical spacer 916a, and a first cathode 915a.

The first anode 912a may be a FCCL substrate. The first anode 912a may be formed of copper.

The first anode 912a and the first cathode 915a may be light transmissive electrodes.

The first anode 912a and the first cathode 915a may be referred to as transparent electrodes.

The first array 210 may include a transparent electrode.

The first anode 912a and the first cathode 915a may include a metal material which is one or a combination of the following: nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO) and Indium Zinc Oxide (IZO).

The first anode 912a may be formed between the second optical spacer 916b and the first inter-layer dielectric film 914a.

The first cathode 915a may be formed on the first inter-layer dielectric film 914a.

The first inter-layer dielectric film 914a may be formed on the first anode 912a.

The first group of micro LED chips 920a may be formed on the first anode 912a. Each micro LED chip 920a belonging to the first group may be attached to the first anode 912a using a solder material or an Anisotropic Conductive Film (ACF).

The first optical spacer 916a may be formed on the first inter-layer dielectric film 914a. The first optical spacer 916a is used to keep a distance between the first group of micro LED chips 920a and the phosphor layer 917, and may be formed of an insulating material.

The phosphor layer 910 may be formed on the first array 210 and the second array 220.

The phosphor layer 917 may be formed on the first optical spacer 916a. The phosphor layer 917 may be formed of resin in which a phosphorus is evenly distributed. Depending on a wavelength of light emitted from the micro LED chips 920a and 920b belonging to the first and second groups, any one selected from a blue light-emitting phosphor, a blue-green light-emitting phosphor, a green light-emitting phosphor, a yellow-green light-emitting phosphor, a yellow light-emitting phosphor, a yellow-red light-emitting phosphor, an orange light-emitting phosphor, and a red light-emitting phosphor may be applied as the phosphor.

The phosphor layer 917 may change a wavelength of lights emitted from first and second micro LED chips 920a and 920b.

The phosphor layer 917 may change a wavelength of a first light generated by the first group of micro LED chips 920a, and a wavelength of a second light generated by the second group of micro LED chips 920b.

The color filter film 918 may be formed on the phosphor layer 917. The color filter film 918 may realize a predetermined color for a light which has passed through the phosphor layer 917. The color filter film 918 may realize at least one or a combination of red (R), green (B), and blue (B).

The cover film 919 may be formed on the color filter film 918. The cover film 919 may protect the array module 200m.

In some implementations, the plurality of micro LED chips 920b included in the second array 220 may be disposed not to overlap the plurality of micro LED chips 920a included in the first array 210 in a vertical or horizontal direction.

The plurality of micro LED chips 920b included in the second group may be disposed not to overlap the plurality of micro LED chips 920a included in the first group in a vertical or horizontal direction.

The vertical direction may be a direction in which the array module 200m is stacked.

The first and second groups of micro LED chips 920a and 920b may output light in the vertical direction.

The horizontal direction may be a direction in which the first and second groups of micro LED chips 920a and 920b are arranged.

The horizontal direction may be a direction in which the base 911, the first and second anodes 912a and 912b, or the phosphor layer 917 extends.

In some implementations, the lamp 100 may further include a wire for supplying power to the array module 200m.

For example, the lamp 100 may include a first wire 219 and a second wire 229.

The first wire 219 may supply power to the first array 210. The first wire 219 may be a pair of wires. The first wire 219 may be connected to the first anode 912a and/or the first cathode 915a.

The second wire 229 may supply power to the second array 220. The second wire 229 may be a pair of wires. The second wire 229 may be connected to the second anode 912*b* and/or the second cathode 915*b*.

The first wire 219 and the second wire 229 may be disposed not to overlap each other.

As described above with reference to FIGS. 1 to 8, the lamp 100 may include the array module 200*m* in which a plurality of micro LED chips is arranged.

Figure 9:
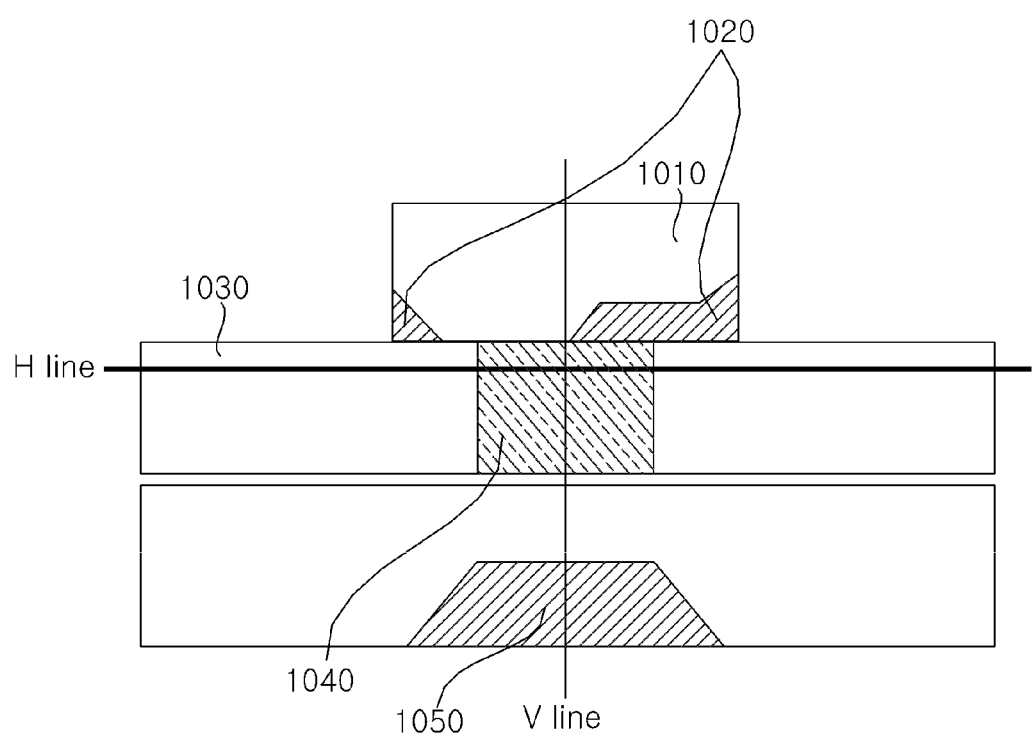
FIG. 9 is a diagram schematically illustrating an example array module.

FIG. 9 is a diagram schematically illustrating an example array module.

FIG. 9 is a diagram illustrating an example of an array module 200*m* seen from a direction from which light generated by the array module 200*m* is incident.

Referring to FIG. 9, the array module 200*m* may include a plurality of regions 1010, 1020, 1030, 1040, and 1050 each including one or more arrays.

At least one of the plurality of regions 1010, 1020, 1030, 1040, or 1050 may include stacked arrays, the number of which is different from the number of stacked arrays in another region among the plurality of regions 1010, 1020, 1030, 1040, and 1050.

The lamp 100 may be required to emit a different amount of light, depending on a regulation or a function thereof.

According to a regulation on an amount of light emitted from a head lamp, a different amount of light is required for a central area and a peripheral area.

In addition, a different amount of light is required in a high-beam area and a low-beam area of the head lamp.

In addition, in order to prevent a headlamp from dazzling a driver's eyes on wet road surfaces, a less amount of light needs to be emitted from a lower side of the light irradiation area than from other sides thereof.

According to a regulation on an amount of light from a rear combination lamp, a central area and a peripheral area of the rear combination lamp are required to emit a different amount of light.

In addition, a tail lamp area and a brake lamp area of the rear combination lamp are required to emit a different amount of light.

The present disclosure provides a lamp for a vehicle, which includes an array module 200*m* in which each irradiation region of the lamp provides a different amount of light.

As illustrated in FIG. 9, the array module 200*m* may include a first region 1010, a second region 1020, a third region 1030, a fourth region 1040, and a fifth region 1050.

For example, the first region 1010 may include stacked arrays, the number of which is different from the number of arrays stacked in at least one of the second region 1020, the third region 1030, the fourth region 1040, or the fifth region 1050.

For example, the second region 1020 may include stacked arrays, the number of which is different from the number of arrays stacked in at least one of the first region 1010, the third region 1030, the fourth region 1040, or the fifth region 1050.

For example, the third region 1030 may include stacked arrays, the number of which is different from the number of arrays stacked in at least one of the first region 1010, the second region 1020, the fourth region 1040, or the fifth region 1050.

For example, the fourth region 1040 may include stacked arrays, the number of which is different from the number of arrays stacked in at least one of the first region 1010, the second region 1020, the third region 1030, or the fifth region 1050.

For example, the fifth region 1050 may include stacked arrays, the number of which is different from the number of arrays stacked in at least one of the first region 1010, the second region 1020, the third region 1030, or the fourth region 1040.

FIG. 9 shows an example in which the array module 200*m* is divided into five regions, but the number of regions of the array module 200*m* is not limited thereto.

Figure 10:
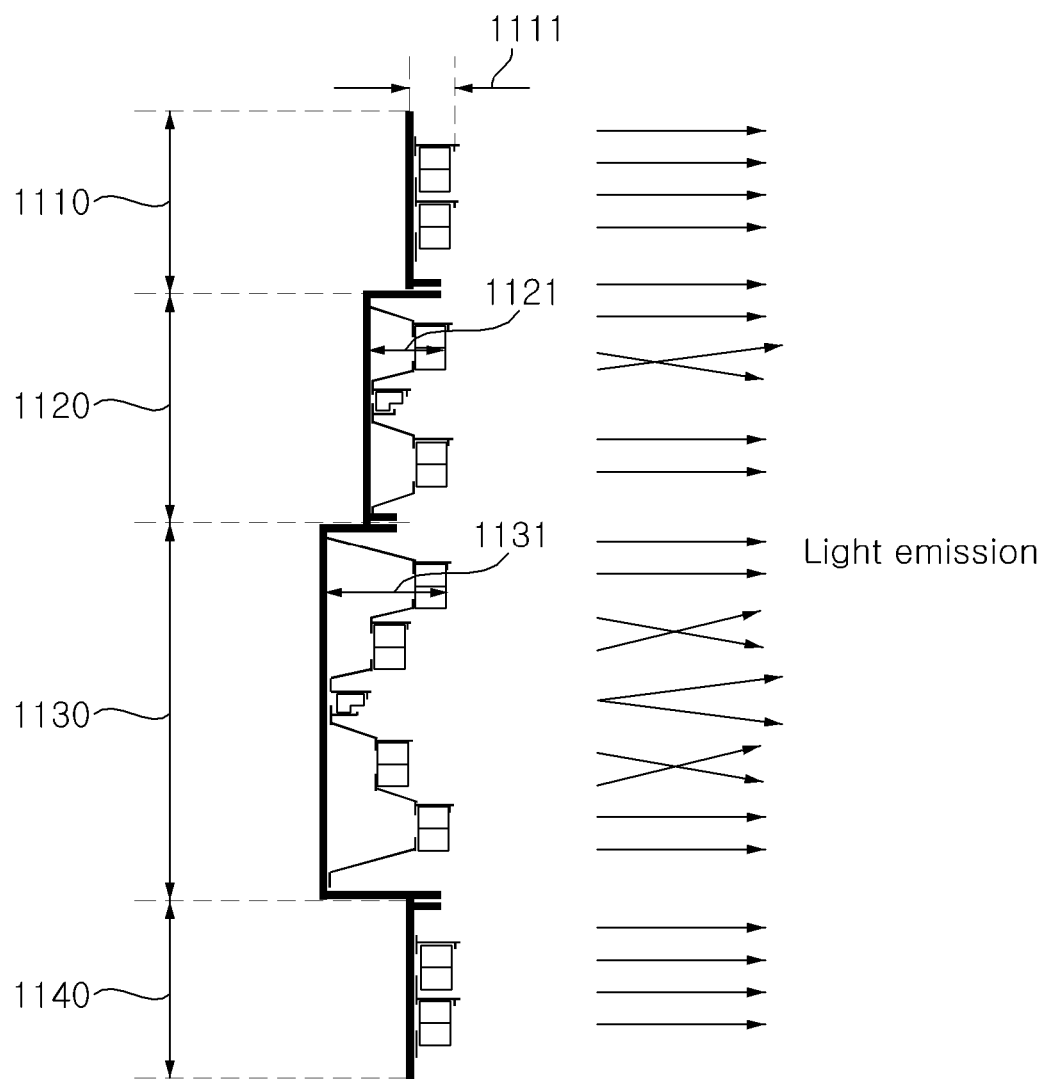
FIGS. 10-16 are diagrams illustrating examples of an array module.

FIG. 10 is a diagram illustrating an example array module.

Referring to FIG. 10, the array module 200*m* may include a plurality of regions 1110, 1120, 1130, and 1140 each including one or more arrays.

At least one of the plurality of regions 1110, 1120, 1130, or 1140 may include stacked arrays, the number of which is different from the number of arrays stacked in another region among the plurality of regions 1110, 1120, 1130, and 1140.

The heights 1111, 1121, and 1131 of regions shown in FIG. 10 conceptually illustrates the number of stacked arrays.

For example, the height 1111 of arrays in the first region 1110 may be smaller than the height 1121 of arrays in the second region 1120, and the number of arrays stacked in the first region 1110 is less than the number of arrays stacked in the second region 1120.

For example, the height 1121 of arrays in the second region 1120 is greater than the height 1111 of arrays in the first region 1110, and the number of arrays stacked in the second region 1120 is more than the number of arrays stacked in the second region 1120 is more than the number of arrays stacked in the first region 1110.

For example, the height 1121 of arrays in the second region 1120 is smaller than the height 1131 of arrays in the third region 1130, and the number of arrays stacked in the second region 1120 is less than the number of arrays stacked in the third region 1130.

For example, the height 1131 of arrays in the third region 1130 is greater than the height 1121 of arrays in the second region 1120, and the number of arrays stacked in the third region 1130 is more than the number of arrays stacked in the second region 1120.

For example, the height 1111 of arrays in the first region 1110 is smaller than the height 1131 of arrays in the third region 1130, and the number of arrays stacked in the first region 1110 is less than the number of arrays stacked in the third region 1130.

For example, the height 1131 of arrays in the third region 1130 is smaller than the height 1111 of arrays in the first region 1110, and the number of arrays stacked in the third region 1130 is less than the number of arrays stacked in the first region 1110.

In some implementations, in the case where a different number of arrays is stacked in each of the plurality of regions 1110, 1120, 1130, and 1140 of the array module 200*m*, the plurality regions 1110, 1120, 1130, and 1140 may have different focal lengths.

If the plurality regions 1110, 1120, 1130, and 1140 of the array module 200*m* has different focal lengths, it is not possible to output light uniformly.

Following is description about an array module 200*m* including a plurality of regions 1110, 1120, 1130, and 1140 in each of which a different number of arrays is stacked, and which remains at a constant focal length.

Figure 11:
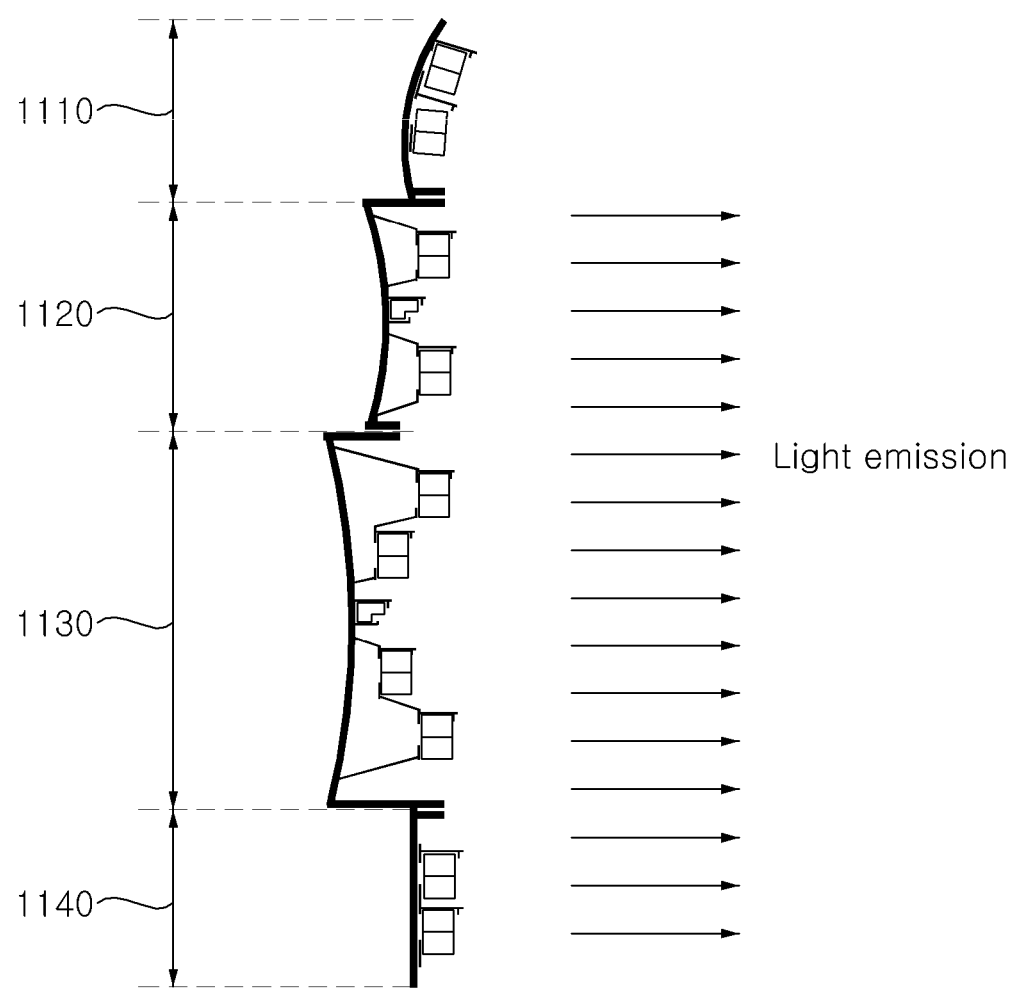

FIG. 11 is a diagram illustrating an example array module.

Referring to FIG. 11, the array module 200*m* may further include a Flexible Printed Circuit Board (FPCB). One or more arrays may be disposed on the FPCB.

The array module 200m may be bendable.

At least one of the plurality of regions 1110, 1120, 1130, or 1140 may be bendable.

The array module 200m may include at least one of the following: a first bending region 1120 and 1130 that are configured to bend toward a light emission direction of a light generated by the array module 200m, a second bending region 1110 that are configured to bend toward a direction opposite to the light emission direction, or an unbending region 1140.

The array module 200m may include a first bending region.

The first bending region may be a portion that bends toward a light emission direction of a light generated by the array module 200m.

Referring to FIG. 11, the second region 1120 and the third region 1130 may correspond to the first bending region.

The first bending region 1120 or 1130 may be a region in which a relatively more number of arrays is stacked.

A region in which two or more arrays are stacked has a focal length shorter than a focal length of a region in which two or more arrays are not stacked. In this case, lights may be concentrated at a certain region, and therefore, the lamp 100 fails to achieve uniform light distribution.

As a region in which a relatively more number of arrays is stacked bends toward a light emission direction, it is possible to enable the lamp 100 to achieve uniform light distribution.

A degree of bending of the first bending region 1120 or 1130 may be determined based on the number of arrays stacked in the first bending region 1120 or 1130.

For example, if a more number of arrays is stacked in the first bending region 1120 or 1130, the first bending region 1120 or 1130 may bend to a greater degree.

For example, the third region 1130 may include arrays more than arrays stacked in the second region 1120. In this case, the third region 1130 may bend to a degree greater than a degree of bending of the second region 1120.

For example, if a less number of arrays is stacked in the first bending region 1120 or 1130, the first bending region 1120 or 1130 may bend to a smaller degree.

For example, the second region 1120 may have arrays more than arrays stacked in the third region 1130. In this case, the second region 1120 may bend to a degree less than a degree of bending of the third region 1130.

In some implementations, the first bending region 1120 or 1130 may bend in at least one of a left-right direction or an upward-downward direction.

For example, when light generated by the array module 200m is emitted forward of the vehicle 10, the first bending region 1120 or 1130 may bend in the overall width direction or the overall height direction.

For example, when light generated by the array module 200m is emitted rearward of the vehicle 10, the first bending region 1120 or 1130 may bend in the overall width direction or the overall height direction.

In some implementations, the lamp 100 may further include a projection lens. The projection lens may be disposed before the array module 200m.

The array module 200m may output a parallel light. For example, the array module 200m may output a parallel light which is incident onto projection lens in a parallel direction.

The array module 200n may include a 1a bending region 1120 and a 1b bending region 1130.

The 1a bending region 1120 may generate a first light.

The 1a bending region 1120 may bend toward a light emission direction of a light generated by the array module 200m.

The 1b bending region 1130 may generate a second light.

The 1b bending region 1130 may include arrays, the number of which is different from the number of arrays stacked in the 1b bending region 1120.

The 1b bending region 1130 may bend toward the light emission direction of the light generated by the array module 200m.

The first light and the second light may be output in parallel due to the bending of the 1a bending region 1120 and the bending of the 1b bending region 1130.

The array module 200m may further include one or more second bending regions 1110 which bend toward a direction opposite to the light emission direction of a light generated by the array module 200m.

In some implementations, the array module 200m may include a first bending region and a second bending region.

In some implementations, the array module 200m may include a first bending region and an unbending region.

In some implementations, the array module 200m may include a second bending region and an unbending region.

In some implementations, the array module 200m may include a first bending region, a second bending region, and an unbending region.

Figure 12:
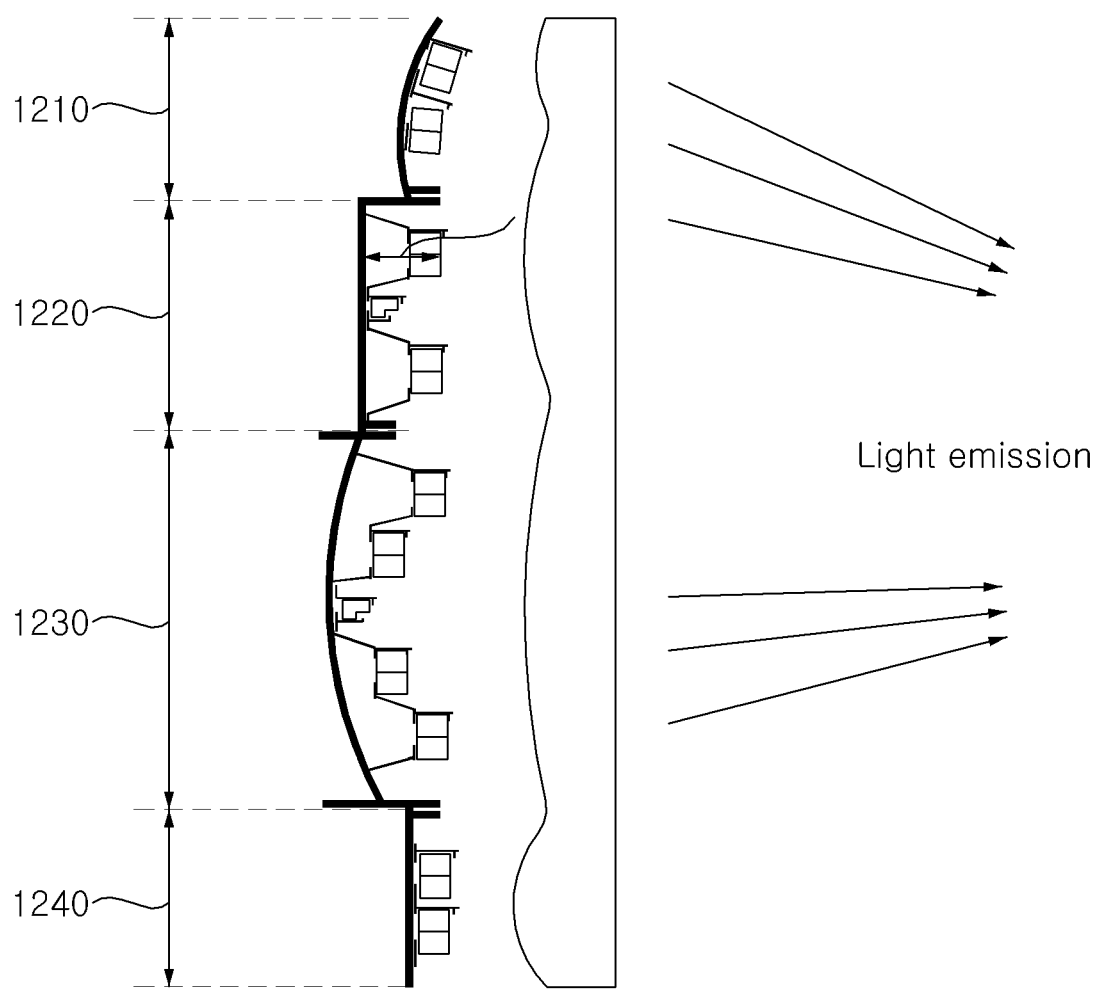

FIG. 12 is a diagram illustrating an example array module.

The same description described with reference to FIGS. 1 to 11 may be applied to what is not described with reference to FIG. 12.

Referring to FIG. 12, the array module 200m may include a plurality of regions 1210, 1220, 1230, and 1240 each including one or more arrays.

At least one of the plurality of regions 1210, 1220, 1230, or 1240 may include stacked arrays, the number of which is different from the number of arrays stacked in another region among the plurality of regions 1210, 1220, 1230, and 1240.

At least one of the plurality of regions 1210, 1220, 1230, or 1240 may be bendable.

The array module 200m may include a second bending region.

The second bending region may be a region which bends toward a direction opposite to the light emission direction of a light generated by the array module 200m.

Referring to FIG. 12, the first region 1210 and the third region 1230 may correspond to a second bending region.

The second bending region 1210 or 1230 may guide light, generated in the second bending region 1210 or 1230, to a target located outside the vehicle 10.

The first region 1210 and the third region 1230 may bend toward a direction opposite to the light emission direction to reduce their respective focal lengths. By reducing the focal lengths, it is possible to guide light to a target located outside the vehicle 10.

In some implementations, the second bending region 1210 or 1230 may bend in at least one of a left-right direction or an upward-downward direction.

For example, when light generated by the array module 200m is output forward of the vehicle 10, the second bending region 1210 or 1230 may bend in the overall width direction or the overall height direction.

For example, when light generated by the array module 200m is output rearward of the vehicle 10, the second bending region 1210 or 1230 may bend in the overall width direction or the overall height direction.

Figure 13:
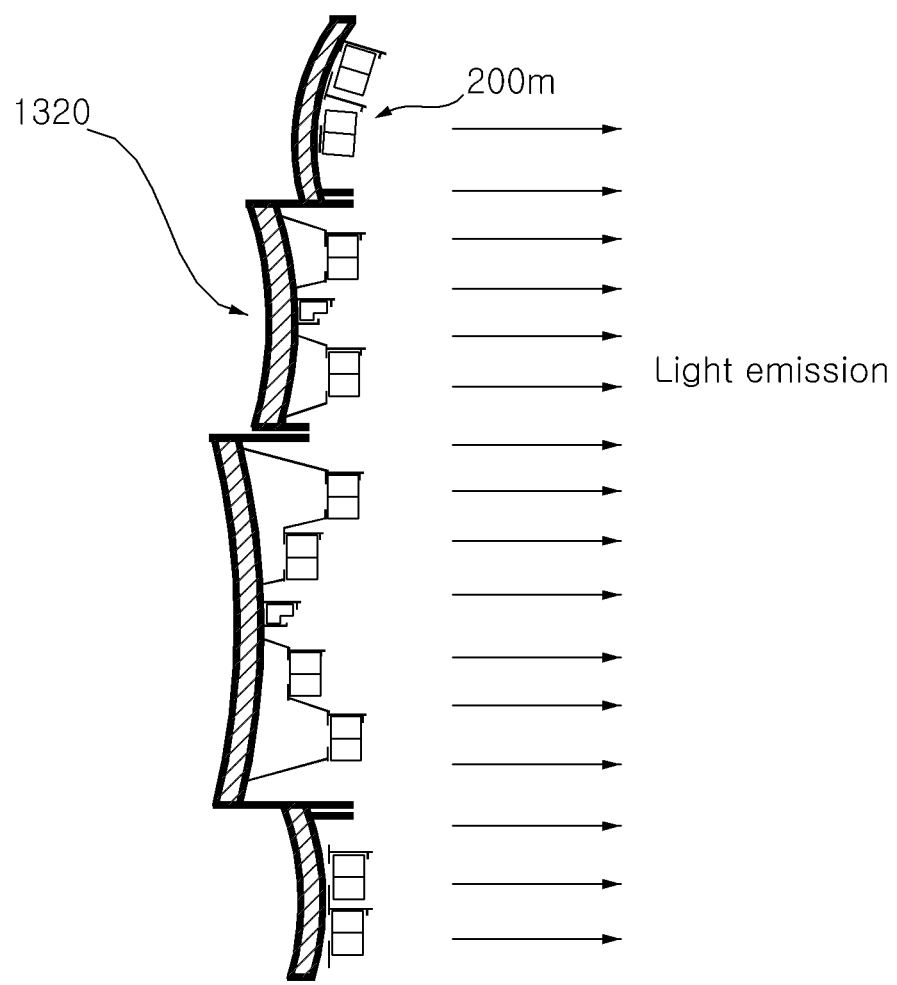

FIG. 13 is a diagram illustrating an example array module.

The same description described with reference to FIGS. 1 to 13 may be applied to what is not described with reference to FIG. 13.

Referring to FIG. 13, the lamp 100 may further include a bracket 1320.

The bracket 1320 may support the array module 200m.

A surface of the bracket 1320 facing the array module 200m may be determined by a bending shape of the array module 200m.

At least portion of the bracket 1320 may be convex toward a light emission direction.

For example, if the array module 200m includes a first bending region, a portion of the bracket 1320 corresponding to the first bending region may be convex toward the light emission direction. In this case, the portion of the bracket 1320 corresponding to the first bending region may be convex with the same degree to which the first bending region bends toward the light emission direction.

At least portion of the bracket 1320 may be concave toward the light emission direction.

For example, if the array module 200m includes a second bending region, a portion of the bracket 1320 corresponding to the second bending region may be convex toward the light emission direction. In this case, a portion of the bracket 1320 corresponding to the second bending region may be concave with the same degree to which the second bending region bends toward the light emission direction.

Figure 14:
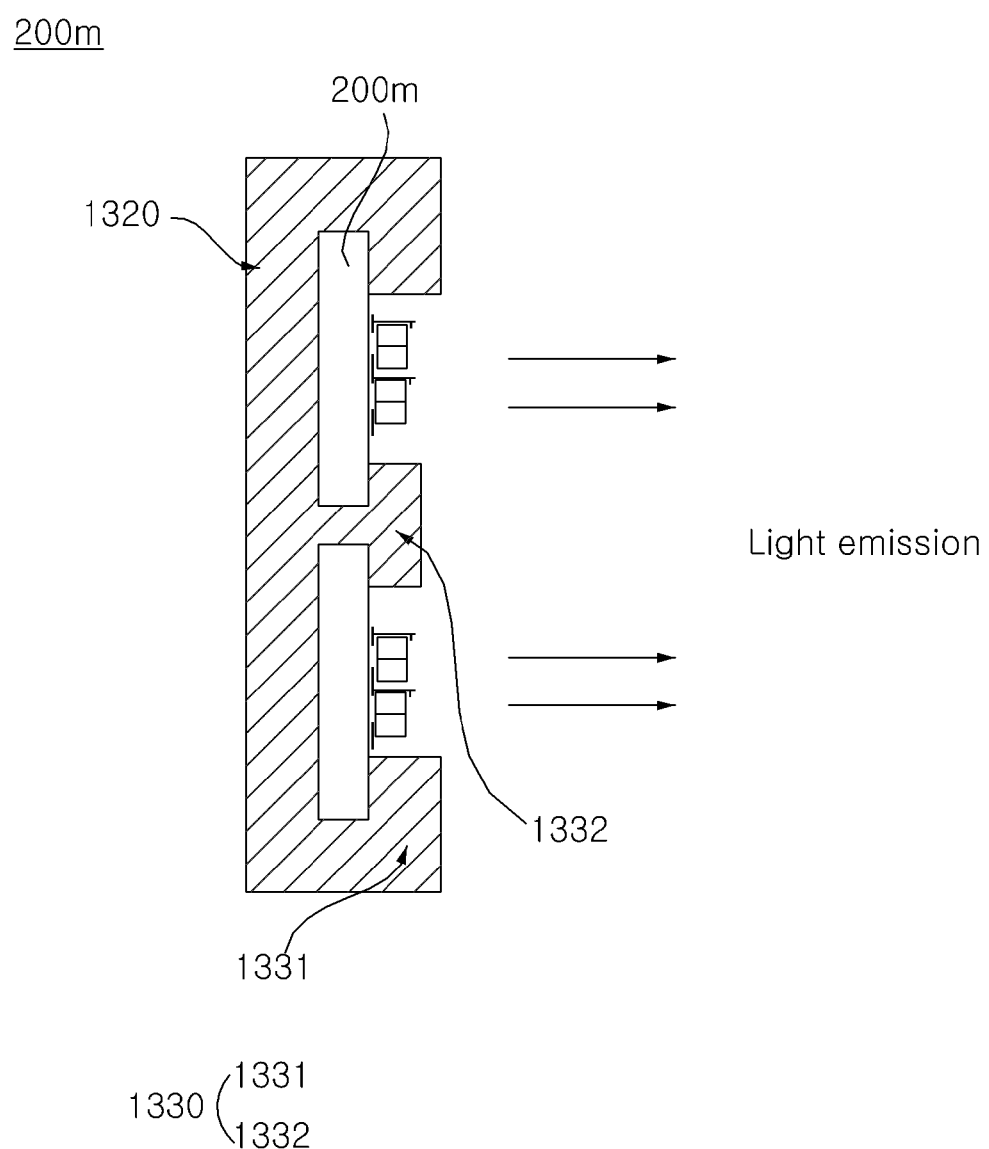

FIG. 14 is a diagram illustrating an example array module.

The description provided with reference to FIGS. 1 to 13 may be applied to what is not described with reference to FIG. 14.

Referring to FIG. 14, the lamp 100 may further include a holder 1330.

The holder 1330 may fix the array module 200m onto the bracket 1320.

The holder 1330 may include at least one of a snap fit 1331 or a hook 1332.

The snap fit 1331 may extend outward of the array module 200m from the bracket 1320 to surround the array module 200m and to fix the array module 200m onto the bracket 1320.

The hook 1332 may extend toward the array module 200m from the bracket 1320 to penetrate the array module 200m and to fix the array module 200m onto the bracket 1320.

As the array module 200m is fixed onto the bracket 1320 using the holder 1330, the array module 200m may be able to be firmly fixed onto the bracket 1320 even in the case where the array module 200m bends.

Figure 15:
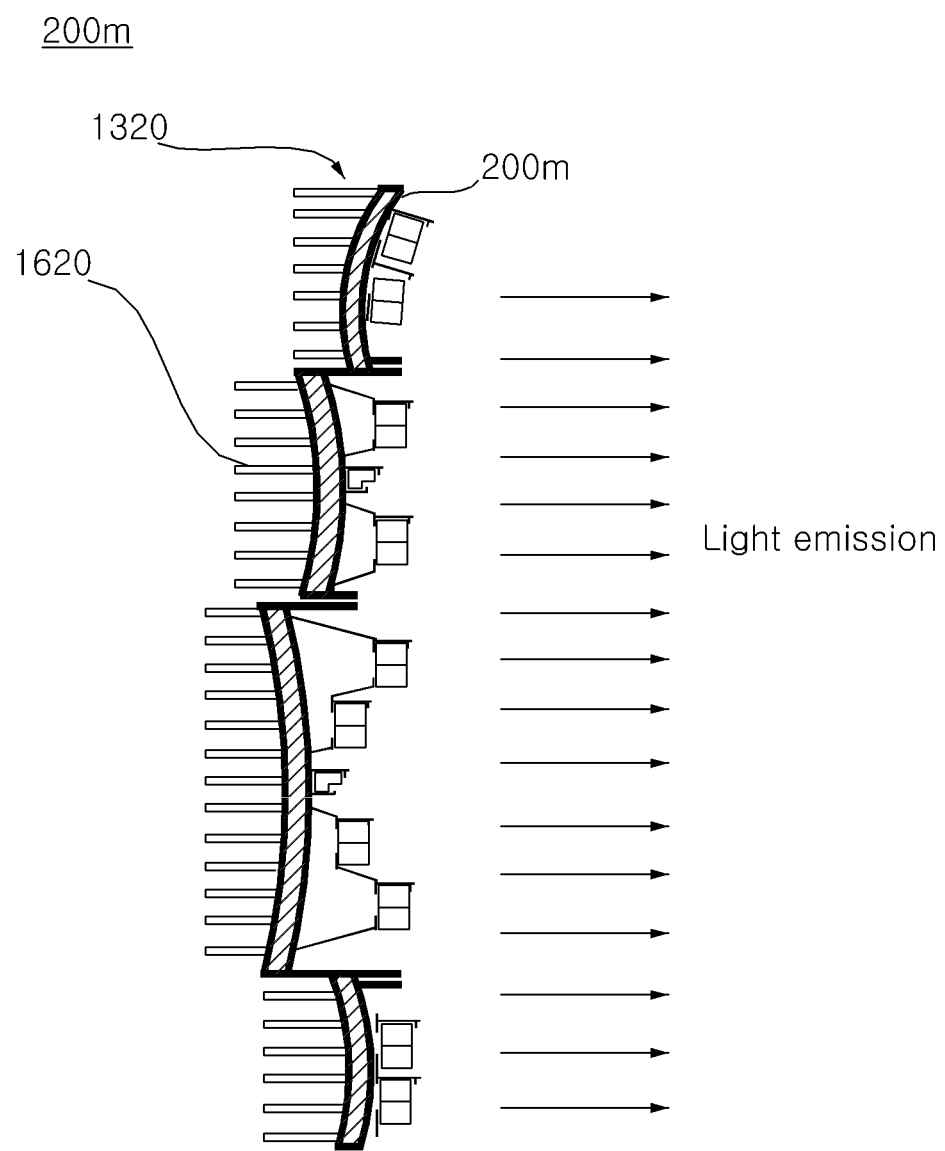

FIG. 15 is a diagram illustrating an example array module.

The description provided with reference to FIGS. 1 to 14 may be applied to what is not described with reference to FIG. 15.

Referring to FIG. 15, the lamp 100 may further include a heat dissipation part 1620.

The heat dissipation part 1620 may manage heat generated by the array module 200m.

For example, the heat dissipation part 1620 may be in the form of a dissipation pin.

The heat dissipation part 1620 may penetrate the bracket 1320.

The heat dissipation part 1620 may penetrate the bracket 1320 to come into contact with the array module 200m.

Figure 16:
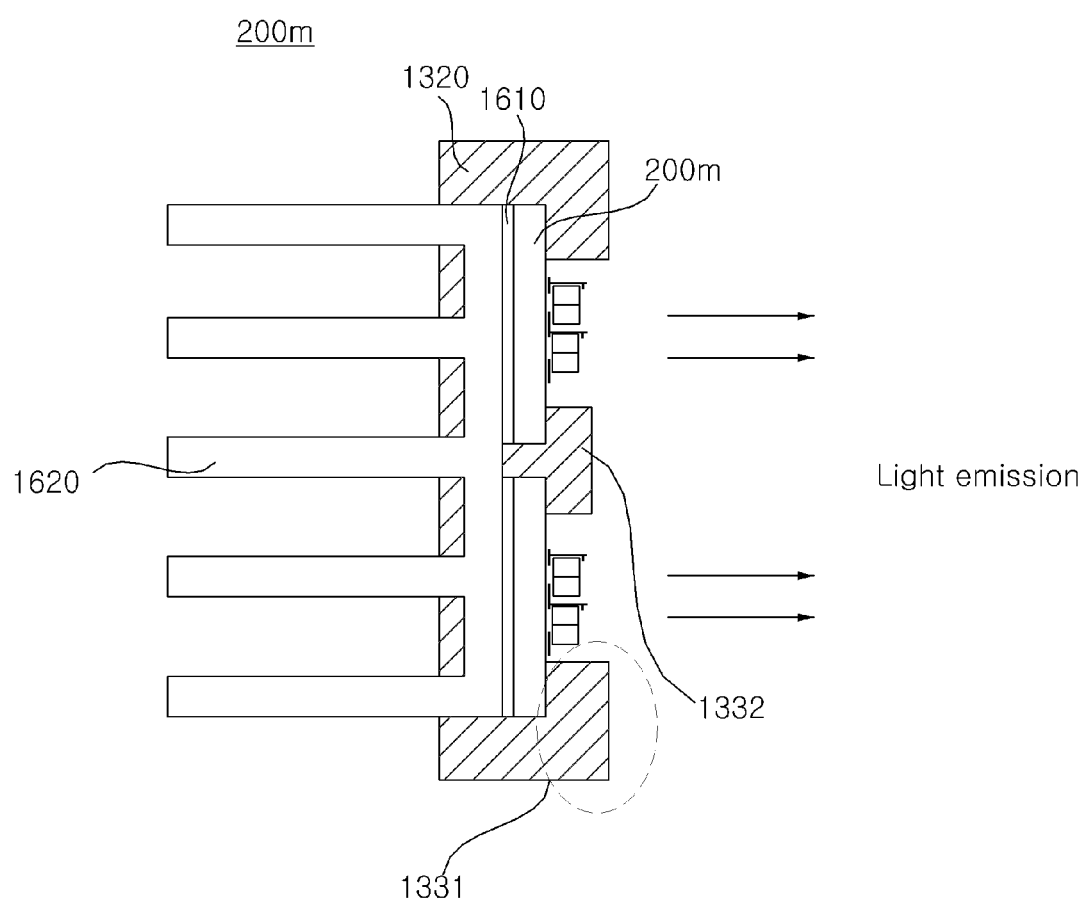

FIG. 16 is a diagram illustrating an example array module.

The description provided with reference to FIGS. 1 to 15 may be applied to what is not described with reference to FIG. 16.

Referring to FIG. 16, the lamp 100 may further include an adhesive portion 1610.

The adhesive portion 1610 may allow the array module 200m and the heat dissipation part 1620 attached to each other.

An adhesive may be applied to the adhesive portion 1610.

FIGS. 17A to 17D are diagrams illustrating examples of an array module.

The description provided with reference to FIGS. 1 to 16 may be applied to what is not described with reference to FIGS. 17A to 17D.

A different amount of heat may be generated depending on the number of stacked arrays.

The heat dissipation part 1620 may include heat dissipation pins having different number and size in each region of the array module 200m.

Figure 17A:
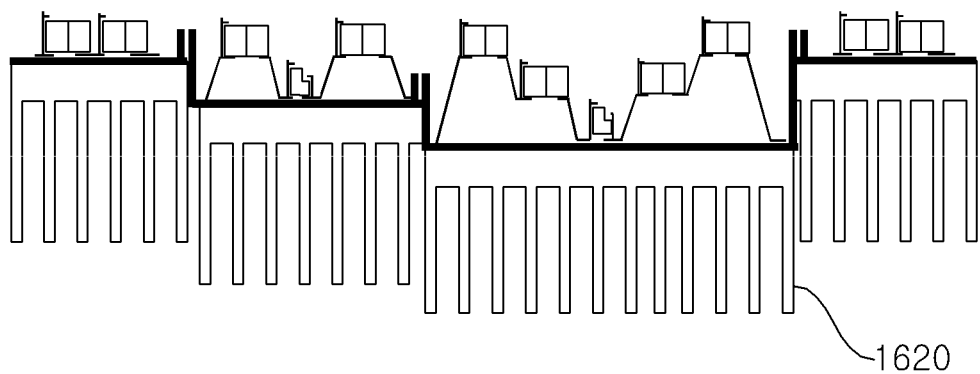
FIGS. 17A to 17D are diagrams illustrating examples of an array module.

As illustrated in FIG. 17A, the heat dissipation part 1620 may include heat dissipation pins which are of a different number for each region of the array module 200m.

If more arrays is stacked in the first region than in the second region, the heat dissipation part 1620 may include heat dissipation pins which are positioned more in an area corresponding to the first region than an area corresponding to the second region.

Figure 17B:
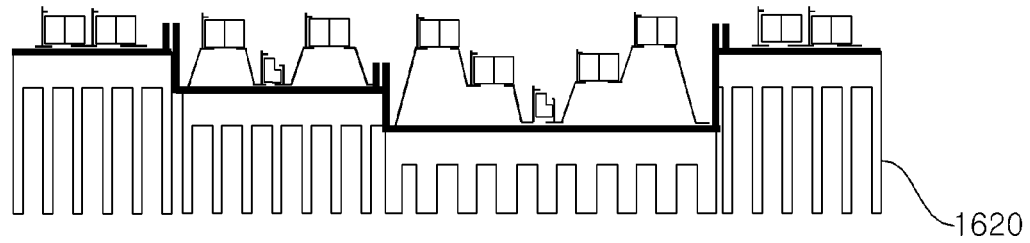

As illustrated in FIG. 17B, the heat dissipation part 1620 may include heat dissipation pins which are of a different thickness for each region of the array module 200m.

If more arrays are stacked in the first region than in the second region, the heat dissipation part 1620 may include heat dissipation pins which are thicker in an area corresponding to the first region than in an area corresponding to the second region.

Figure 17C:
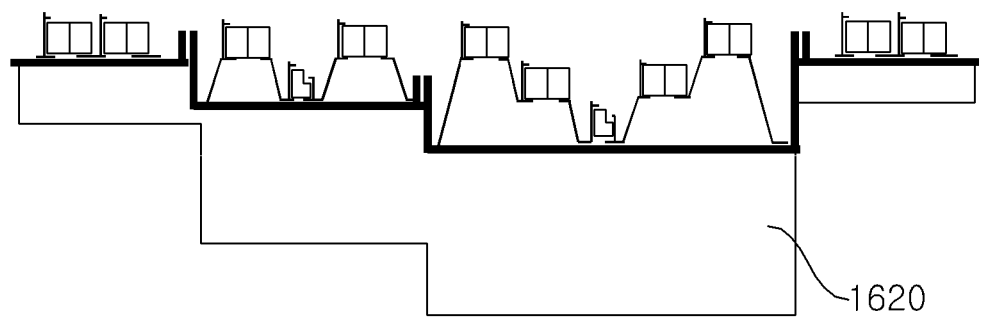

As illustrated in FIG. 17C, the heat dissipation part 1620 may be of a different thickness for each region of the array module 200m.

If more arrays are stacked in the first region than in the second region, the heat dissipation part 1620 may be thicker in an area corresponding to the first region than in an area corresponding to the second region.

Figure 17D:
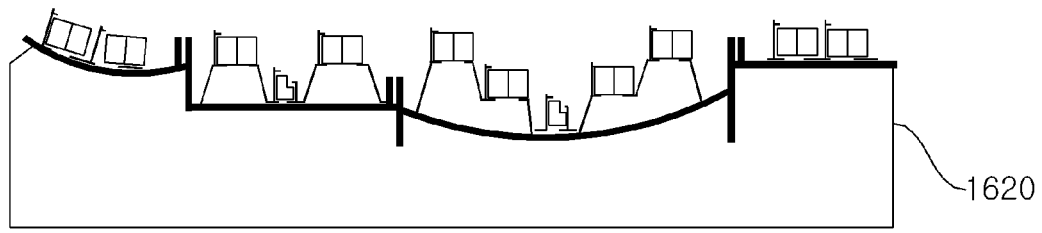

As illustrated in FIG. 17D, the heat dissipation part 1620 may be formed such that a surface of the heat dissipation part 1620 facing the array module 200m is formed round.

The heat dissipation part 1620 may be formed such that a surface of the heat dissipation part 1620 in contact with the array module 200m is convex toward a light emission direction or toward a direction opposite to the light emission direction.

The present disclosure as described above may be implemented as code that can be written on a computer-readable medium in which a program is recorded and thus read by a computer. The computer-readable medium includes any kinds of recording devices in which data is stored in a computer-readable manner. Examples of the computer-readable recording medium may include a hard disk drive (HDD), a solid state disk (SSD), a silicon disk drive (SDD), a read only memory (ROM), a random access memory (RAM), a compact disk read only memory (CD-ROM), a magnetic tape, a floppy disc, and an optical data storage device. In addition, the computer-readable medium may be implemented as a carrier wave (e.g., data transmission over the Internet). In addition, the computer may include a processor or a controller. Thus, the above detailed description should not be construed as being limited to the implementations set forth herein in all terms, but should be considered by way of example. The scope of the present disclosure should be determined by the reasonable interpretation of the accompanying claims and all changes in the equivalent range of the present disclosure are intended to be included in the scope of the present disclosure.

Although implementations have been described with reference to a number of illustrative implementations thereof, it should be understood that numerous other modifications and implementations can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternatives uses will also be apparent to those skilled in the art.

What is claimed is:

1. A lamp for a vehicle, comprising:
   an array module comprising a plurality of micro Light Emitting Diode (LED) chips,
   wherein the array module is configured to generate light in a light emission direction,
   wherein the array module comprises a plurality of regions, each region comprising one or more arrays, each array comprising at least a portion of the plurality of micro LED chips,
   wherein at least one of the plurality of regions comprises arrays that are stacked on each other in layers,
   wherein a number of arrays stacked at a first region among the plurality of regions is different from a number of arrays stacked in a second region among the plurality of regions, the first region being different from the second region, and the first and second regions providing different amounts of light, and
   wherein the micro LED chips included in the stacked arrays do not overlap in the light emission direction of the array module.

2. The lamp according to claim 1, wherein the array module further comprises a Flexible Printed Circuit Board (FPCB) configured to seat the one or more arrays.

3. The lamp according to claim 1, wherein the plurality of regions comprise a first bending region configured to bend toward the light emission direction of light generated by the array module.

4. The lamp according to claim 3, wherein a number of arrays stacked in the first bending region is configured to determine a degree of bending of the first bending region.

5. The lamp according to claim 4, wherein the degree of bending of the first bending region is configured to increase based on an increase of the number of arrays stacked in the first bending region.

6. The lamp according to claim 3, wherein the first bending region is configured to bend in at least one of a left-right direction or an upward-downward direction with respect to a forward direction of the vehicle.

7. The lamp according to claim 3, wherein the first bending region is configured to seat first stacked arrays of one or more micro LED chips configured to generate first light, the first bending region being configured to orient the first light toward a first light emission direction,
   wherein the plurality of regions of the array module further comprise a second bending region that is configured to bend toward a second light emission direction parallel to the first light emission direction and that is configured to seat second stacked arrays of micro LED chips configured to generate second light, the second bending region being configured to orient the second light toward the second light emission direction, and
   wherein a number of the second stacked arrays is different from a number of the first stacked arrays.

8. The lamp according to claim 1, wherein the array module further comprises one or more bending regions that are configured to bend toward a direction opposite to the light emission direction of light generated by the array module.

9. The lamp according to claim 8, wherein the one or more bending regions are configured to guide, to a target located outside of the vehicle, light generated by one or more micro LED chips disposed at the one or more bending regions.

10. The lamp according to claim 8, wherein the one or more bending regions are configured to bend in at least one of a left-right direction or an upward-downward direction with respect to a forward direction of the vehicle.

11. The lamp according to claim 3, further comprising a bracket configured to support the array module, the bracket having a surface configured to face the array module,
    wherein a bending shape of the array module is configured to determine a shape of the surface of the bracket that faces the array module.

12. The lamp according to claim 11, further comprising a holder configured to fix the array module to the bracket.

13. The lamp according to claim 12, further comprising a heat dissipation part configured to dissipate heat generated by the array module, the heat dissipation part being configured to penetrate the bracket.

14. The lamp according to claim 13, further comprising an adhesive portion configured to attach the array module to the heat dissipation part.

15. A vehicle, comprising:
    one or more wheels;
    a power source configured to drive the one or more wheels; and
    a lamp mounted to the vehicle;
    wherein the lamp comprises an array module comprising a plurality of micro Light Emitting Diode (LED) chips,
    wherein the array module is configured to generate light in a light emission direction,
    wherein the array module comprises a plurality of regions, each region comprising one or more arrays, each array comprising at least a portion of the plurality of micro LED chips,
    wherein at least one of the plurality of regions comprises arrays that are stacked on each other in layers,
    wherein a number of arrays stacked at a first region among the plurality of regions is different from a number of arrays stacked in a second region among the plurality of regions, the first region being different from the second region, and the first and second regions providing different amounts of light, and
    wherein the micro LED chips included in the stacked arrays do not overlap in the light emission direction of the array module.

16. The vehicle according to claim 15, wherein the plurality of regions comprise a first bending region configured to bend toward the light emission direction of light generated by the array module.

17. The vehicle according to claim 16, wherein a number of arrays stacked in the first bending region is configured to determine a degree of bending of the first bending region.

18. The vehicle according to claim 17, wherein the degree of bending of the first bending region is configured to increase based on an increase of the number of arrays stacked in the first bending region.

19. The vehicle according to claim 16, wherein the first bending region is configured to bend in at least one of a left-right direction or an upward-downward direction with respect to a forward direction of the vehicle.

20. The vehicle according to claim 16, wherein the first bending region is configured to seat first stacked arrays of one or more micro LED chips configured to generate first light, the first bending region being configured to orient the first light toward a first light emission direction, wherein the plurality of regions of the array module further comprise a second bending region that is configured to bend toward a second light emission direction parallel to the first light emission direction and that is configured to seat second stacked arrays of micro LED chips configured to generate second light, the second bending region being configured to orient the second light toward the second light emission direction, and wherein a number of the second stacked arrays is different from a number of the first stacked arrays.

\* \* \* \* \*